United States Patent
Houlihan et al.

(10) Patent No.: US 7,473,512 B2
(45) Date of Patent: Jan. 6, 2009

(54) PROCESS OF IMAGING A DEEP ULTRAVIOLET PHOTORESIST WITH A TOP COATING AND MATERIALS THEREOF

(75) Inventors: Francis M. Houlihan, Millington, NJ (US); Ralph R. Dammel, Flemington, NJ (US); Andrew R. Romano, Pittstown, NJ (US); Raj Sakamuri, Sharon, MA (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 433 days.

(21) Appl. No.: 11/044,305

(22) Filed: Jan. 27, 2005

(65) Prior Publication Data

US 2005/0202340 A1   Sep. 15, 2005

Related U.S. Application Data

(63) Continuation-in-part of application No. 10/875,596, filed on Jun. 24, 2004, now abandoned, which is a continuation-in-part of application No. 10/796,376, filed on Mar. 9, 2004, now abandoned.

(51) Int. Cl.
  *G03F 7/00* (2006.01)
  *G03F 7/004* (2006.01)
(52) U.S. Cl. .............. 430/273.1; 430/270.1; 430/311
(58) Field of Classification Search ............. 430/270.1, 430/913
  See application file for complete search history.

(56) References Cited

U.S. PATENT DOCUMENTS

| | | | |
|---|---|---|---|
| 4,491,628 A | 1/1985 | Ito et al. |
| 5,069,997 A | 12/1991 | Schwalm et al. |
| 5,350,660 A | 9/1994 | Urano et al. |
| 5,585,219 A | 12/1996 | Kaimoto et al. |
| 5,750,312 A | 5/1998 | Chandross et al. |
| 5,843,624 A | 12/1998 | Houlihan et al. |
| 6,057,080 A | 5/2000 | Brunsvold et al. |

(Continued)

FOREIGN PATENT DOCUMENTS

EP   0 794 458 A2   9/1997

(Continued)

OTHER PUBLICATIONS

Notification of Transmittal of the International Search Report and the Written Opinion of the International Searching Authority, or the Declaration (Form PCT/ISA/220); International Search Report (Form PCT/ISA/210);and Written Opinion of the International Searching Authority (Form PCT/iSA/237) for PCT/IB2005/000627.

(Continued)

*Primary Examiner*—Amanda C. Walke
(74) *Attorney, Agent, or Firm*—Sangya Jain

(57) ABSTRACT

The present invention relates to a process for imaging deep ultraviolet (uv) photoresists with a topcoat using deep uv immersion lithography. The invention further relates to a topcoat composition comprising a polymer with at least one ionizable group having a $pK_a$ ranging from about −9 to about 11. The invention also relates to a process for imaging a photoresist with a top barrier coat to prevent contamination of the photoresist from environmental contaminants.

27 Claims, 11 Drawing Sheets

Optical path of light rays for air and an immersion medium.

U.S. PATENT DOCUMENTS

| | | | |
|---|---|---|---|
| 6,107,006 | A | 8/2000 | Chang |
| 6,365,322 | B1 | 4/2002 | Padmanaban et al. |
| 6,447,980 | B1 | 9/2002 | Rahman et al. |
| 6,788,477 | B2 | 9/2004 | Lin |
| 6,875,555 | B1 | 4/2005 | Feiring et al. |
| 6,933,005 | B2 * | 8/2005 | Graham et al. .............. 427/142 |
| 7,288,362 | B2 | 10/2007 | Allen et al. |
| 2002/0163629 | A1 | 11/2002 | Switkes et al. |
| 2003/0108815 | A1 | 6/2003 | Jung et al. |
| 2003/0235782 | A1 | 12/2003 | Padmanaban et al. |
| 2004/0009425 | A1 | 1/2004 | French et al. |
| 2004/0265733 | A1 | 12/2004 | Houlihan et al. |
| 2005/0036183 | A1 | 2/2005 | Yeo et al. |
| 2005/0123863 | A1 | 6/2005 | Chang et al. |
| 2007/0087286 | A1 | 4/2007 | Wang et al. |
| 2007/0269734 | A1 | 11/2007 | Kimura et al. |

FOREIGN PATENT DOCUMENTS

| | | |
|---|---|---|
| EP | 1 319 981 A2 | 6/2003 |
| GB | 2 320 718 A | 7/1998 |
| WO | WO 97/33198 | 9/1997 |
| WO | WO 00/11712 | 3/2000 |
| WO | WO 00/67072 | 11/2000 |
| WO | WO 01/98834 A1 | 12/2001 |
| WO | WO 02/065212 A1 | 8/2002 |

OTHER PUBLICATIONS

Jung et al., "Quencher gradient resist process for low k process", SPIE vol. 5376, No. 1, pp. 63—pp. 70, 2004, XP002372988.

Sato, M., "TOK Resist & Material Development Status for Immersion Lithography", www.sematech.org/resources/litho/meetings, Jan. 29, 2004, XP002350074.

Tran et al. "Metal-Catalyzed Vinyl Addition Polymers for 157 nm Resist Applications. 2. Fluorinated Norbornenes: Synthesis, Polymerization, and Initial Imaging Results", Macromolecules vol. 35, pp. 6539-6549 (2002).

Kodama et al., "Synthesis of Novel Fluoropolymer for 157nm Photoresists by Cyclo-polymerization", Proc. of SPIE vol. 4690, pp. 76-83 (2002).

U.S. Appl. No. 10/863,042, filed Jun. 8, 2003, Rahman et al.

Switkes et al., "Immersion Liquids for Lithography in Deep Ultraviolet", Proc. of SPIE vol. 5040, pp. 690-694 (2003).

George Odlan, "Principles of Polymerization 2nd Ed.", A Wiley-Interscience Publication, NY, pp. 194, pp. 448, and pp. 508 (1981).

Sorenson et al., "Preparative Methods of Polymer Chemistry", Interscience Publishers, Inc., NY, pp. 149 and pp. 235 (1961).

Hung et al., "Resist Materials for 157nm Microlithography: An Update", Advances in Resist Technology and Processing XVII (Proceedings of SPIE) vol. 4345, pp. 385-391 (2001).

Office Action from the USPTO date mailed Jul. 6, 2005 for U.S. Appl. No. 10/875,596.

The Notification Concerning Transmittal of International Preliminary Report on Patentability (Chapter 1 of the Patent Cooperation Treaty) (Form PCT/IB/326), of the International Preliminary Report on Patentability (Form PCT/IB373), and the Written Opinion of the International Search Authority (Form PCT/ISA/237) for PCT/IB2005/000627.

Petrillo et al., "Chemically amplified resists processing with top coats for deep-ultraviolet and e-beam applications", J. Vac. Sci. Technol. B 16(n), pp. 3709-pp. 3715 (Nov./Dec. 1998).

* cited by examiner

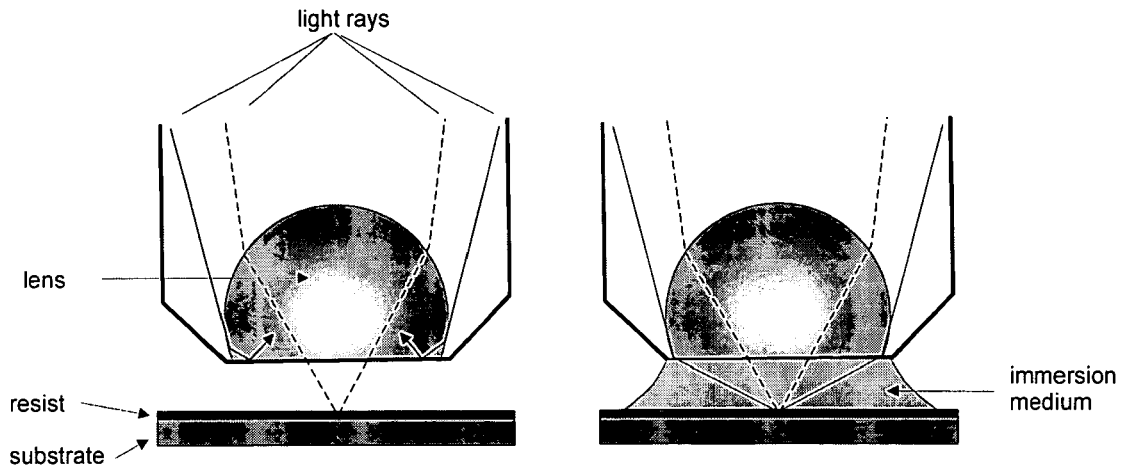
Figure 1: Optical path of light rays for air and an immersion medium.
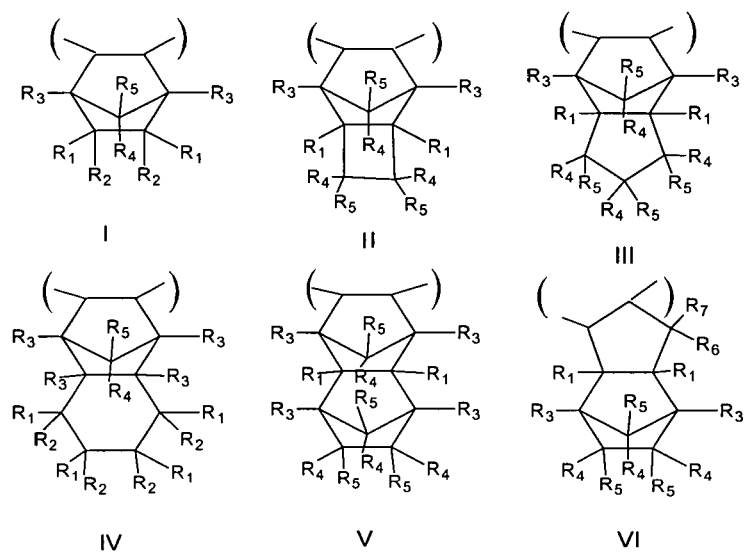
Figure 2: Multicyclic repeat units comprising an ionizable group

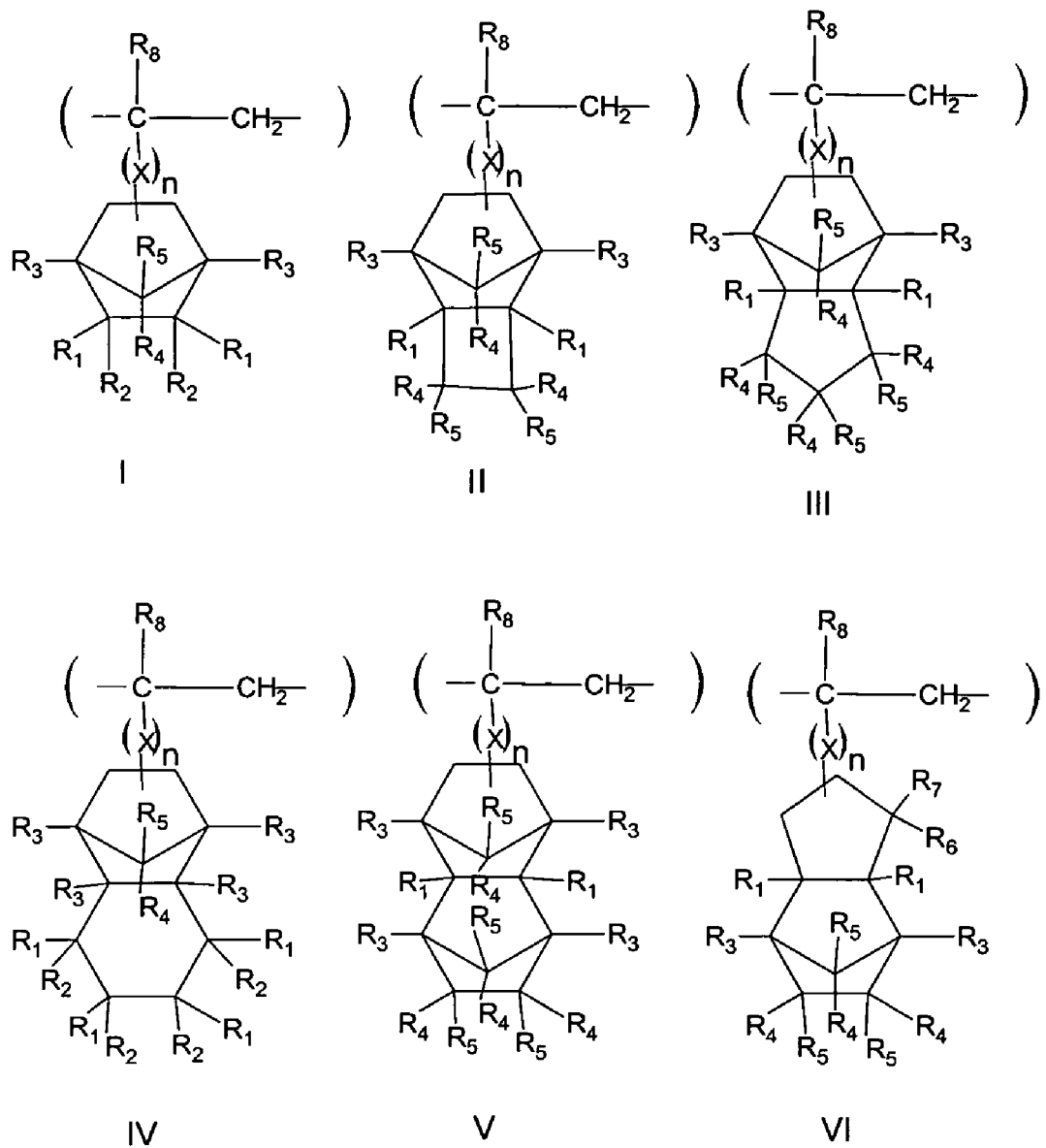
Figure 3: Multicyclic repeat units that comprising an ionizable group.

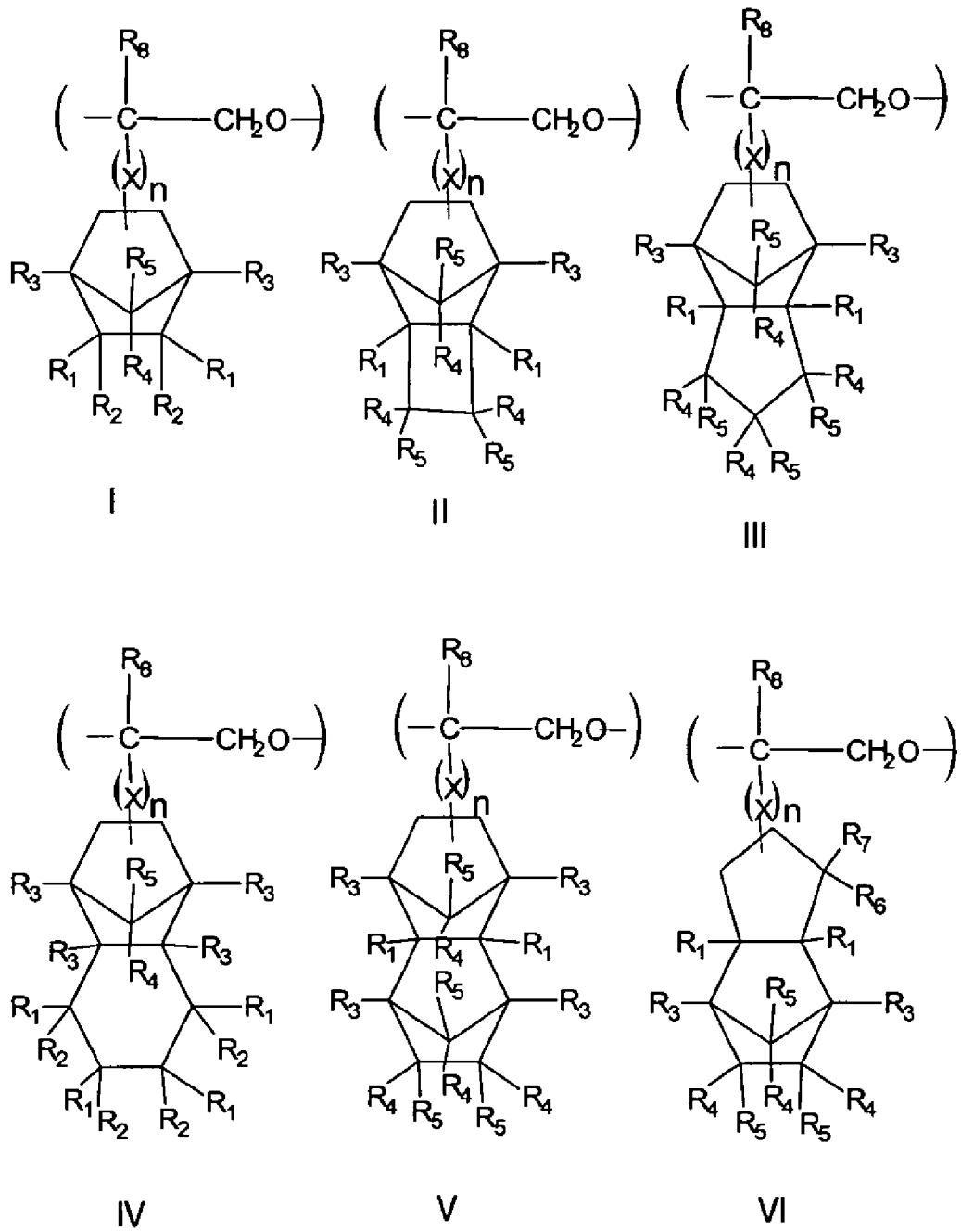
Figure 4: Multicyclic units with an ionizable group.

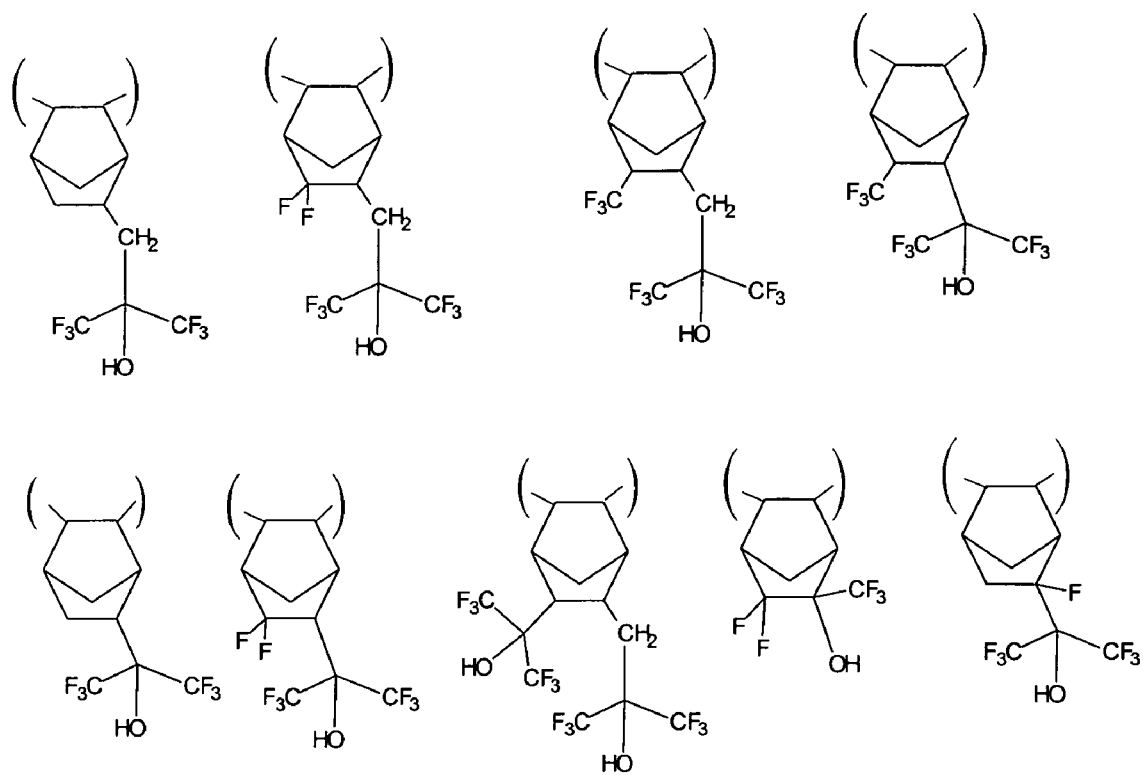
Figure 5: Examples of fluoroalcohol bearing norbornene repeat units.

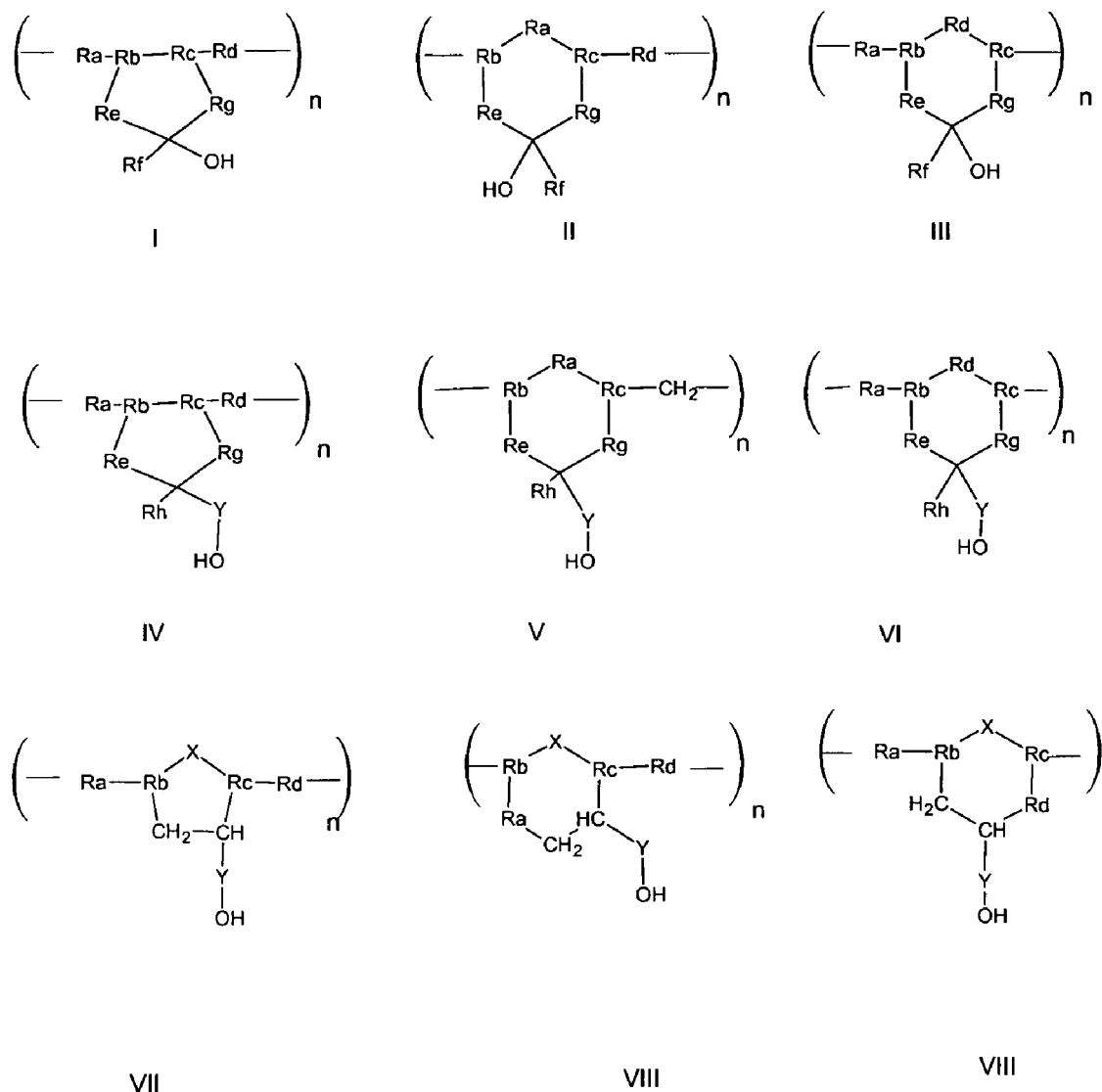
Figure 6: Monocyclic polymers having pendant hydroxy groups

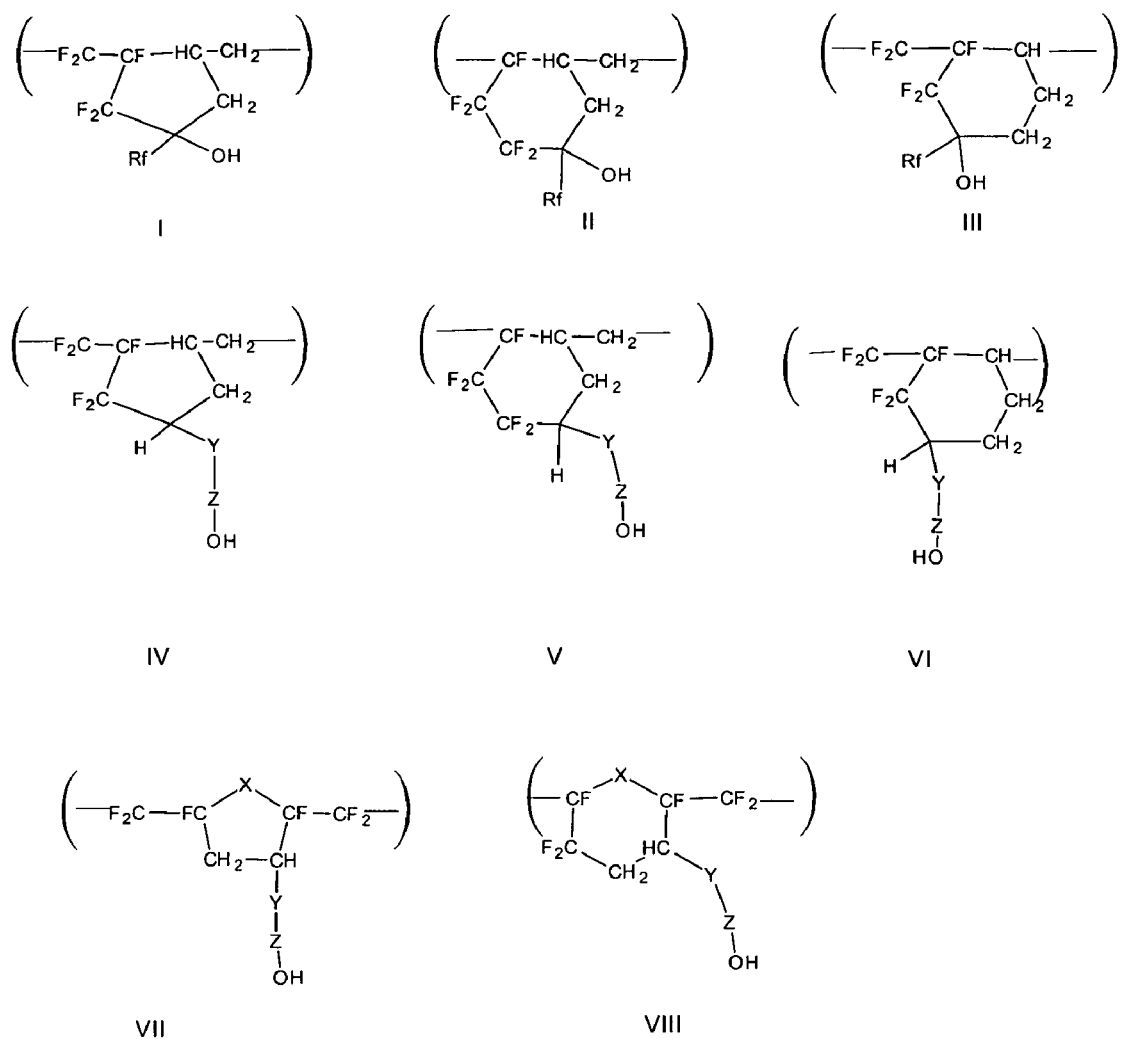
Figure 7: Partially fluorinated monocyclic polymers having pendant alcohol groups

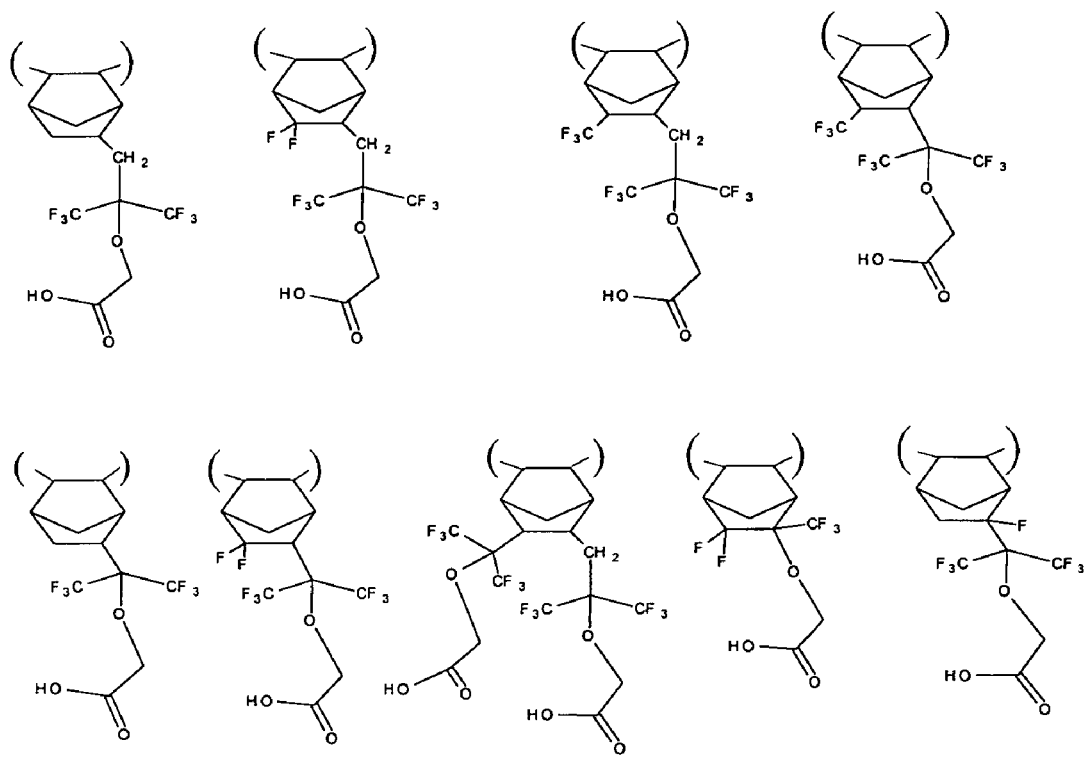
Figure 8: Examples of alkylcarboxylic acid capped norbornene repeat units.
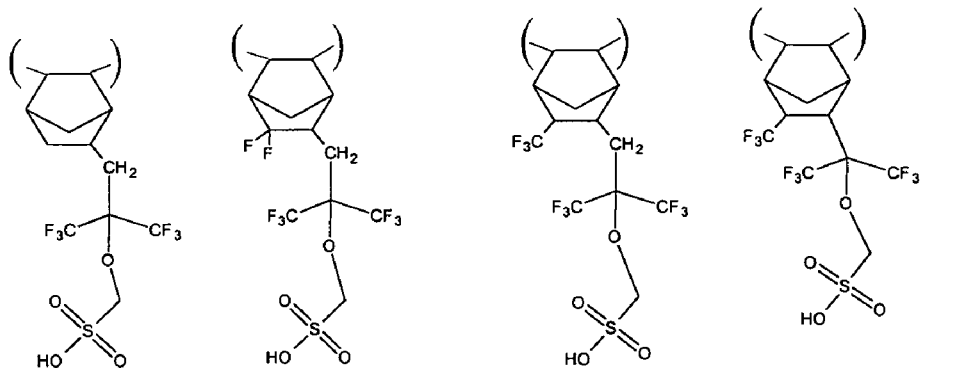
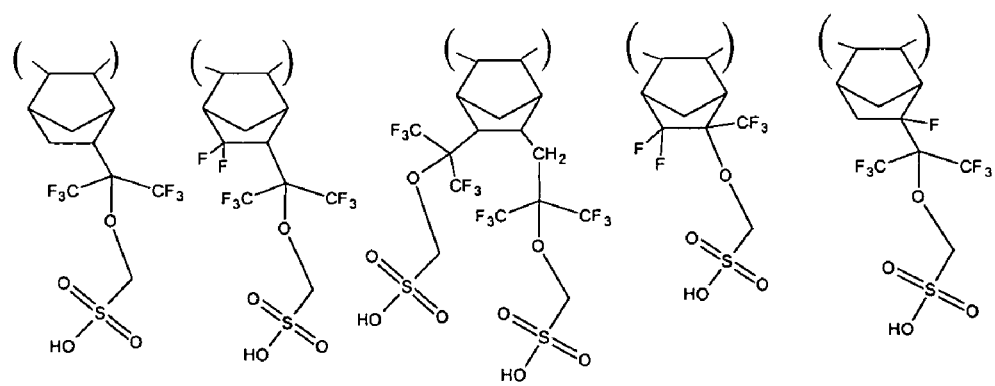
Figure 9: Examples of alkylsulfonic acid capped norbornene repeat units.

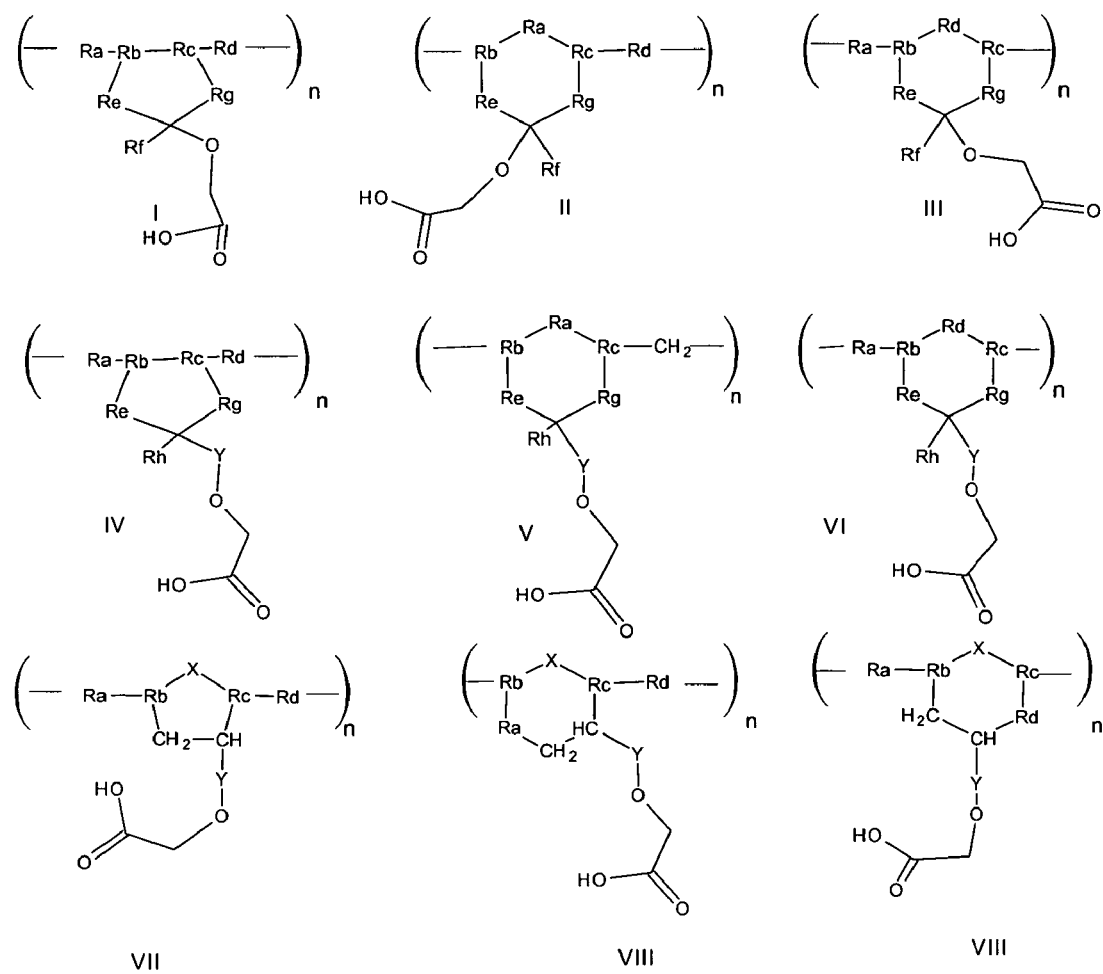
Figure 10: Generic monocyclic polymers

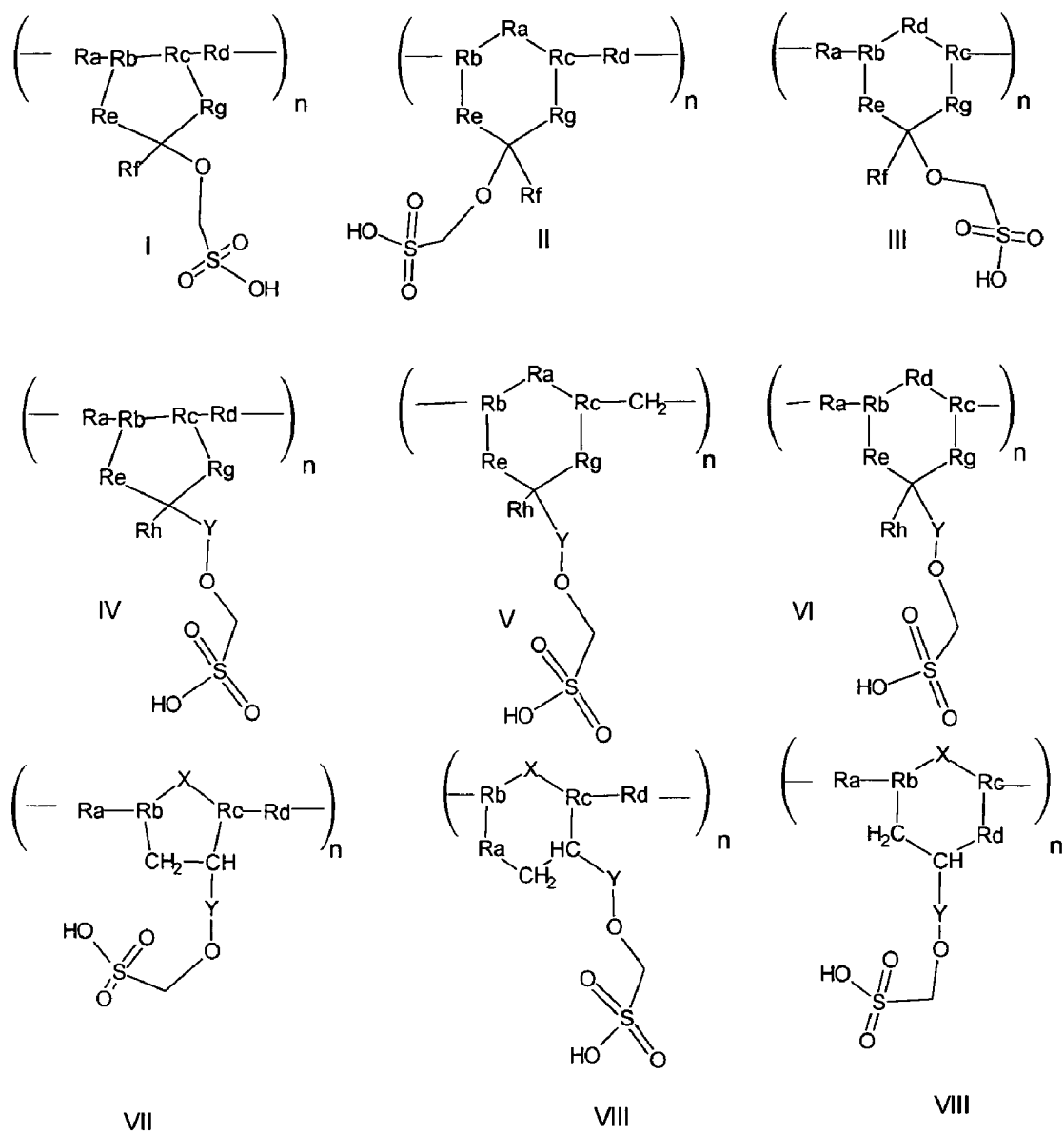
Figure 11: Generic monocyclic polymers

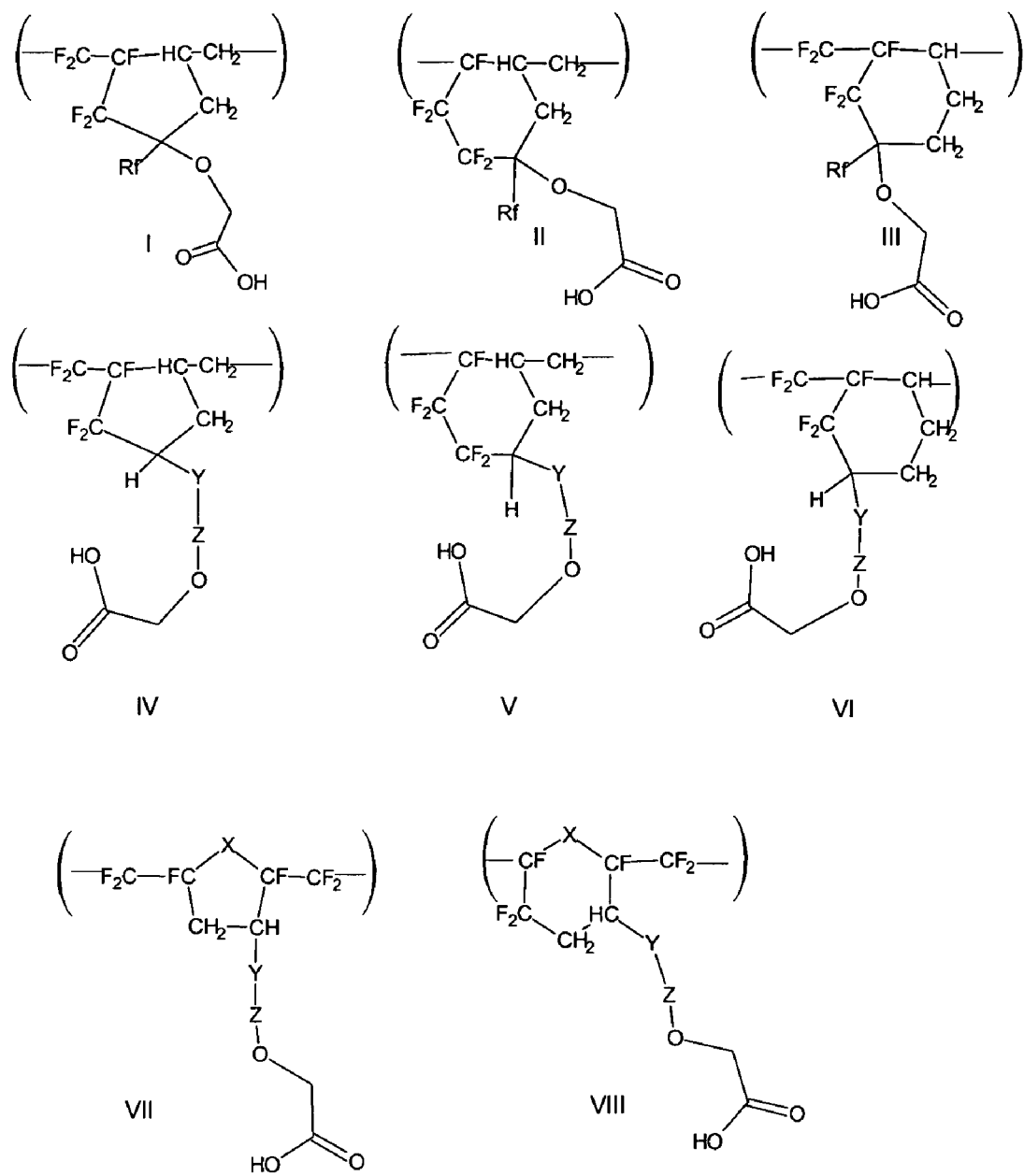
Figure 12: Partially fluorinated monocyclic polymers

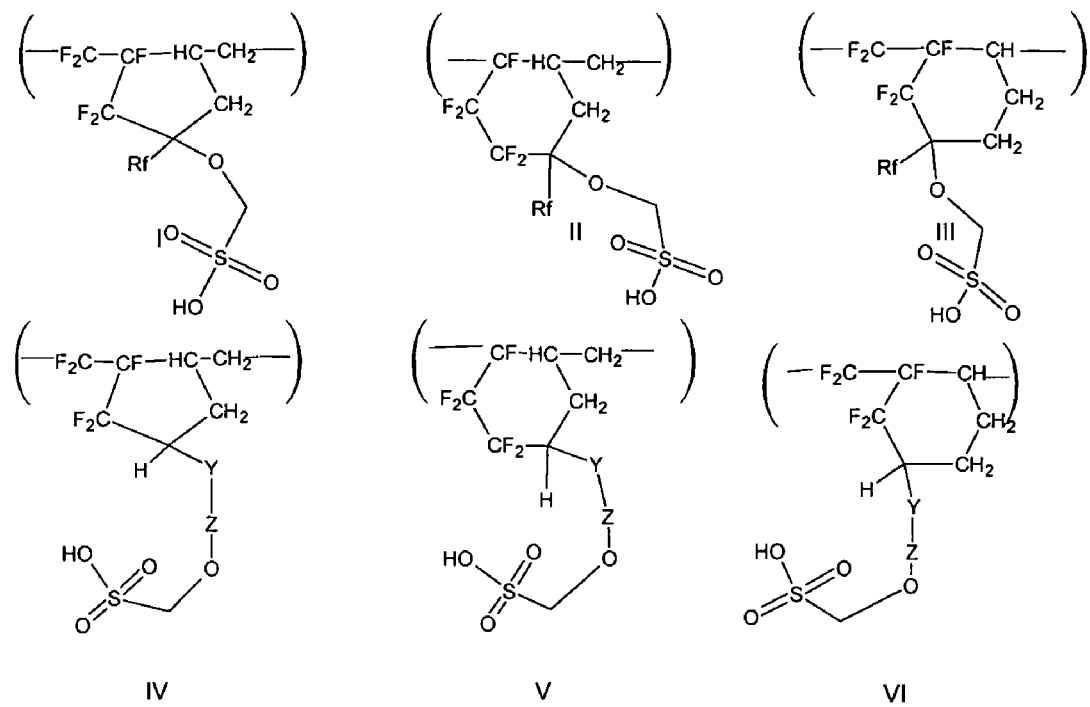
Figure 13: Partially fluorinated monocyclic polymers
Figure 14: Examples of comonomeric repeat units.

PROCESS OF IMAGING A DEEP ULTRAVIOLET PHOTORESIST WITH A TOP COATING AND MATERIALS THEREOF

CROSS-REFERENCE TO RELATED APPLICATION

This application is a continuation-in-part of U.S. patent application Ser. No. 10/875,596 filed Jun. 24, 2004, now abandoned which is a continuation-in-part of U.S. patent application Ser. No. 10/796,376 filed Mar. 9, 2004, now abandoned the contents of which are hereby incorporated herein by reference.

FIELD OF INVENTION

The present invention relates to a process for imaging deep ultraviolet (uv) photoresists with a topcoat using deep uv immersion lithography. The invention further relates to a topcoat composition comprising a polymer with at least one ionizable group having a $pK_a$ ranging from about −9 to about 11. The invention also relates to a process for imaging a deep uv photoresist with a top barrier coat to prevent environmental contamination of the photoresist, when exposure is done in air or other gases.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive at lower and lower wavelengths of radiation and has also led to the use of sophisticated multilevel systems to overcome difficulties associated with such miniaturization.

Positive working photoresists when they are exposed image-wise to radiation have those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Again, a desired portion of the underlying surface is uncovered.

Negative working photoresists when they are exposed image-wise to radiation, have those areas of the photoresist composition exposed to the radiation become insoluble to the developer solution while those areas not exposed remain relatively soluble to the developer solution. Thus, treatment of a non-exposed negative-working photoresist with the developer causes removal of the unexposed areas of the coating and the formation of a negative image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many leading edge manufacturing applications today, photoresist resolution on the order of less than 100 nm is necessary. In addition, it is almost always desirable that the developed photoresist wall profiles be near vertical relative to the substrate. Such. demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm, are often used where subhalfmicron geometries are required. Particularly preferred are photoresists comprising non-aromatic polymers, a photoacid generator, optionally a dissolution inhibitor, and solvent.

High resolution, chemically amplified, deep ultraviolet (100-300 nm) positive and negative tone photoresists are available for patterning images with less than quarter micron geometries. To date, there are three major deep ultraviolet (uv) exposure technologies that have provided significant advancement in miniaturization, and these use lasers that emit radiation at 248 nm, 193 nm and 157 nm. Photoresists for 248 nm have typically been based on substituted polyhydroxystyrene and its copolymers, such as those described in U.S. Pat. Nos. 4,491,628 and 5,350,660. On the other hand, photoresists for exposure below 200 nm require non-aromatic polymers since aromatics are opaque at this wavelength. U.S. Pat. No. 5,843,624 and GB 2320718 disclose photoresists useful for 193 nm exposure. Generally, polymers containing alicyclic hydrocarbons are used for photoresists for exposure below 200 nm. Alicyclic hydrocarbons are incorporated into the polymer for many reasons, primarily since they have relatively high carbon hydrogen to ratios which improve etch resistance, they also provide transparency at low wavelengths and they have relatively high glass transition temperatures. U.S. Pat. No. 5,843,624 discloses polymers for photoresist that are obtained by free radical polymerization of maleic anhydride and unsaturated cyclic monomers, but the presence of maleic anhydride makes these polymers insufficiently transparent at 157 nm.

Two basic classes of photoresists sensitive at 157 nm, and based on fluorinated polymers with pendant fluoroalcohol groups, are known to be substantially transparent at that wavelength. One class of 157 nm fluoroalcohol photoresists is derived from polymers containing groups such as fluorinated-norbornenes, and are homopolymerized or copolymerized with other transparent monomers such as tetrafluoroethylene (Hoang V. Tran et al Macromolecules 35, 6539, 2002, WO 00/67072, and WO 00/17712) using either metal catalyzed or radical polymerization. Generally, these materials give higher absorbencies but have good plasma etch resistance due to their high alicyclic content. More recently, a class of 157 nm fluoroalcohol polymers was described in which the polymer backbone is derived from the cyclopolymerization of an asymmetrical diene such as 1,1,2,3,3-pentafluoro-4-trifluoromethyl-4-hydroxy-1,6-heptadiene (Shun-ichi Kodama et al Advances in Resist Technology and Processing XIX, Proceedings of SPIE Vol. 4690 p76 2002; WO 02/065212) or copolymerization of a fluorodiene with an olefin (WO 01/98834-A1). These materials give acceptable absorbance at 157 nm, but due to their lower alicyclic content as compared to the fluoro-norbornene polymer, have lower plasma etch resistance. These two classes of polymers can often be blended to provide a balance between the high etch resistance of the first polymer type and the high transparency at 157 nm of the second polymer type.

In order to further improve the resolution and depth of focus of photoresists, immersion lithography is a technique that has recently been used to extend the resolution limits of deep uv lithography imaging. In the traditional process of dry lithography imaging, air or some other low refractive index gas, lies between the lens and the wafer plane. This abrupt change in refractive index causes rays at the edge of the lens to undergo total internal reflection and not propagate to the wafer (FIG. 1). In immersion lithography a fluid is present between the objective lens and the wafer to enable higher orders of light to participate in image formation at the wafer plane. In this manner the effective numerical aperture of the optical lens (NA) can be increased to greater than 1, where $NA_{wet}=n_i \sin\theta$, where $NA_{wet}$ is the numerical aperture with immersion lithography, $n_i$ is refractive index of liquid of immersion and $\sin\theta$ is the angular aperture of the lens. Increasing the refractive index of the medium between the lens and the photoresist allows for greater resolution power and depth of focus. This in turn gives rise to greater process latitudes in the manufacturing of IC devices. The process of immersion lithography is described in 'Immersion liquids for lithography in deep ultraviolet' Switkes et al. Vol. 5040, pages 690-699, Proceedings of SPIE, and incorporated herein by reference.

For 193 nm and 248 nm and higher wavelengths immersion lithography, water is of sufficient inherent transparency so that it can be used as the immersion fluid. Alternatively, if a higher NA is desired, water's refractive index can be increased by doping with UV transparent solutes. However, for 157 nm lithography, water's high absorbance makes it unsuitable as an immersion fluid. Currently certain oligomeric fluorinated ether solvents have been used as suitable immersion fluids.

One important concern in immersion lithography is the extraction of components from the photoresist film into the immersion fluid. These components may either be ones present in the film prior to exposure (e.g. base additives, photoacid generators, solvent, dissolution inhibitors, plasticizers, leveling agents,) or present in the film during or shortly after exposures (e.g. photoacid, photoacid generator, photofragments, scission fragments from the polymer or the other additives, salt of the photoacid and base additive.) The extraction of these materials is of concern for two reasons: firstly, it may affect resist performance deleteriously, and the second is the deposition of UV absorbing films on the objective lens in contact with the immersion fluid due to the photoreaction of extracted components in the immersion fluid.

Thus there is a need for a barrier coat having good optical transparency at the exposure wavelength, which can be spun onto the photoresist from a solvent system which will not redissolve the photoresist, and where the barrier coating layer is also insoluble in the immersion liquid, but can be removed easily during the normal aqueous base development step.

It is also known that chemically amplified photoresists, especially those based on the catalytic deprotection of an acid labile group, are particularly sensitive to amine contamination from the environment. The presence of amines can poison the acid generated during the photolytic process and neutralize the acid necessary for the deprotection of the polymer. This phenomenon is known and described in U.S. Pat. No. 5,750,312, where an acidic barrier coat is coated on top of the photoresist. Protection of the photoresist is particularly desirable for instances where a chemically amplified photoresist is exposed in air or other gases. U.S. Pat. No. 5,750,312 particularly describes acid polymers based on carboxylic acids, such as, poly(methacrylate-co-methacrylic acid) and poly(benzyl methacrylate-co-methacrylic acid) coated over a photoresist sensitive at 248 nm. Such top coats cannot be used for photoresists sensitive at 193 nm and at 157 nm, since the top coats described in U.S. Pat. No. 5,750,312 have insufficient transparency at 193 nm, and especially 157 nm. Thus there is a need for new transparent polymers that can act as effective barrier top coats for 193 nm and 157 nm exposure wavelengths.

The inventors of this application have found that, surprisingly, a barrier coating composition comprising certain polymers and an alkyl alcohol solvent can be employed as effective barrier against removal of photoresist components or photoresist photoproduct during the imaging process using immersion lithography. Additionally, the inventors have found that polymers comprising an acidic fluoralcohol group may be used as top barrier coats for the prevention of amine contamination of the photoresist, when exposure is undertaken in air or other gases.

SUMMARY OF THE INVENTION

The invention relates to a process for imaging a photoresist comprising the steps of, a) forming a coating of a photoresist on a substrate, b) forming a barrier coating over the photoresist from a barrier coating solution, c) imagewise exposing the photoresist and the barrier coating using immersion lithography, further where the immersion lithography comprises an immersion liquid between the barrier coating and the exposure equipment, and, d) developing the coatings with an aqueous alkaline solution.

The invention further relates to the barrier coating solution for a deep ultraviolet photoresist imaged with immersion lithography, where the barrier coating is soluble in an aqueous alkaline solution and insoluble in water, and comprises an alkyl alcohol solvent and a polymer comprising an ionizable group, further where the pKa of the ionizable group ranges from about −9 to about 11. The invention also relates to a process for imaging a photoresist in the deep uv to prevent environmental contamination comprising the steps of, a) forming a coating of a photoresist on a substrate, b) forming a barrier coating over the photoresist from a barrier coating solution, c) imagewise exposing the photoresist and the barrier coating, and, d) developing the coatings with an aqueous alkaline solution, further wherein the barrier coating solution comprises a polymer comprising an acidic fluoroalcohol group and a solvent composition. In a preferred embodiment the polymer has a pKa of less than 9.

BRIEF DESCRIPTION OF THE DRAWINGS

FIG. 1 refers to a schematic depiction of the fate difference in order of light ray capture between a "dry" lens and wafer interface and one in which there is a fluid between this interface.

FIG. 2 shows possible repeat units of barrier polymer containing multicyclic repeat units that form the backbone of a polymer chain in which at least one of the substituents comprises an ionizable group, to give the unit in Structure 1.

FIG. 3 shows repeat units of barrier polymer containing multicyclic repeat units that form the backbone of a polymer chain in which at least one of the substituents comprises an ionizable group, to give the unit in Structure 1.

FIG. 4 shows repeat units of barrier polymer containing multicyclic repeat units that form the backbone of a polymer chain in which at least one of the substituents comprises an ionizable group, to give the unit in Structure 1.

FIG. 5 illustrates examples of fluoroalcohol bearing norbornene repeat units.

FIG. 6 illustrates monocyclic polymers having pendant hydroxy groups.

FIG. 7 illustrates partially fluorinated monocyclic polymers having pendant alcohol groups.

FIG. 8 shows examples of alkylcarboxylic acid capped fluoroalcohol bearing norbornene repeat units.

FIG. 9 shows examples of alkylsulfonic acid capped fluoroalcohol bearing norbornene repeat units.

FIG. 10 shows generic monocyclic polymer repeat units having pendant hydroxy groups capped with methylcarboxylic acid moieties.

FIG. 11 shows generic monocyclic polymer repeat units having pendant hydroxy groups capped with methylsulfonic acid moieties.

FIG. 12 shows partially fluorinated monocyclic polymer repeat units having pendant alcohol groups capped with alkylcarboxylic acid groups.

FIG. 13 shows partially fluorinated monocyclic polymer repeat units having pendant alcohol groups capped with alkylsulfonic acid groups.

FIG. 14 illustrates examples of other comonomeric repeat units.

DETAILED DESCRIPTION OF THE INVENTION

The present invention relates to the use of a barrier coating over a photoresist coating during the imaging process for the photoresist using immersion lithography. The barrier coating constituents are soluble in solvents that do not significantly dissolve the components of the photoresist and the coating is also insoluble in water and can further be removed by an aqueous alkaline solution. The barrier coating is transparent to the wavelength of radiation used to expose the photoresist. The invention also relates to a composition for the barrier coating comprising a polymer containing a recurring unit with an ionizable group, and an alkyl alcohol solvent. The photoresist is preferably imaged with radiation ranging from about 450 nm to about 150 nm, preferably from about 300 nm to about 150 nm and more preferably using 248 nm, 193 nm or 157 nm exposure radiation. The invention further relates to a process for imaging a photoresist which is susceptible to environmental contamination by coating the photoresist with a top barrier coat, where the polymer of the top barrier coat comprises an acidic fluorinated alcohol group and is soluble in aqueous base developer and which can be spun from a solvent composition which will not redissolve the underlying photoresist.

A photoresist is coated on a substrate and baked to essentially remove the coating solvent of the photoresist. A barrier coating of the present invention is then coated over the photoresist, and optionally baked, to essentially remove the coating solvent of the barrier coat. The coatings are then imagewise exposed to radiation in an exposure unit capable of using immersion lithography, where the immersion liquid is present between the exposure equipment and the coatings. After exposure the coatings are baked and developed using an aqueous alkaline developer. During the development process the barrier coating is removed, together with the exposed areas of the photoresist for a positive photoresist or unexposed areas of the photoresist for the negative photoresists.

The barrier coating composition comprises a polymer and an alkyl alcohol solvent, or a mixture of solvents (e.g. an alkylcarboxylate with an alkane, or an alkyl alcohol with either an alkane or water) where the polymer comprises at least one recurring unit with an ionizable group. The polymer is essentially insoluble in water but soluble in an aqueous alkaline solution. The ionizable group on the polymer provides the required solubility in an aqueous alkaline solution. Preferably the barrier coating has a dissolution rate of less than 1% of the film thickness while immersed for 30 seconds in the immersion liquid, where, in one embodiment, the immersion liquid in the exposure process comprises water. Other immersion liquids may also be used, providing the barrier coat meets the dissolution criterion described. The recurring unit of the polymer containing the ionizable group is described in Structure 1, where R is a recurring moiety which is part of the polymeric backbone, W is an optional spacer group, ZH comprises the ionizable group and t=0-5.

(1)

ZH is a proton bearing polar functionality, where the pKa (acid dissociation constant) for Z- in aqueous media ranges from about −9 to about 11. Examples of ZH are OH (where the OH group is attached to the polymer to make the group ionizable, e.g. OH is attached to a substituted or unsubstituted phenyl group or a beta substituted fluoroalkyl moiety), $(SO_2)_2NH$, $(SO_2)_3CH$, $(CO)_2NH$, $SO_3H$ and $CO_2H$. A beta substituted fluoroalkyl moiety with the OH group (fluoroalcohol) may be exemplified by $-C(C_nF_{2n+1})_2OH$ (n=1-8), particularly ($-C(CF_3)_2OH$). W is an optional spacer group where t can be from 0 to 5. W may be any group but may be exemplified by groups such as phenylmethoxy, methylene, ($C_1$-$C_{10}$) alkylene, cylcoalkylene, ($C_1$-$C_{10}$) fluoroalkylene, cycloakylene, multicyclic alkylene or multicyclic fluoroalkylene and equivalents. R is a backbone unit of the polymer and may be aromatic, linear or branched aliphatic, cycloaliphatic, multicycloaliphatic, fluorinated analogs of these, silicon containing repeat unit (such as a silicone) or a combination of both.

The polymer of the barrier coating is water insoluble but soluble in aqueous alkaline solutions. Therefore, the recurring units of the barrier polymer are such that these physical solubility parameter requirements are met, which can be undertaken by designing a polymer with at least one unit of structure 1. Other comonomer units may be present in the polymer to control the solubility characteristics such that the polymer is water insoluble but soluble in aqueous alkaline solutions. In a particular polymer if the recurring unit of structure 1 alone is not sufficient to give the desired solubility characteristics then another monomer may be incorporated into the polymer to give the desired solubility, and/or the moiety ZH in the recurring unit of structure 1 may be partially capped with a group which increases or decreases the hydrophobicity or the hydrophilicity and acidity. In addition the spacer group, W, may be chosen such that it provides the desired solubility characteristics. A polymer comprising mixtures of monomers containing different ionizable groups may also be used. Furthermore, physical blends of polymers of this invention may be used to give the desired solubility characteristics.

The ionizable group, ZH, may be bound directly to the polymer backbone moiety, R. Alternatively the ionizable group, ZH, may be connected to R through a spacer group, W. The spacer group may be any hydrocarbyl moiety containing essentially hydrogen and carbon atoms, but may contain some heteroatoms, such as oxygen, fluorine, etc. W may be aromatic, multi or mono aliphatic cyclic moiety, linear or branched aliphatic, multi or mono fluoroaliphatic cyclic moiety, or linear or branched fluoroaliphatic. W may be exemplified, without limitation, by phenyl, oxyphenyl, oxyphenylalkylene, cycloalkyl, mutlicycloalkyl, oxyalkylene, oxycycloalkylalkylene, and oxycycloalkylfluoroalkylene.

The backbone of the polymer, R, is a moiety in the repeat unit forming the backbone of the polymer. It may be aromatic, aliphatic, or a mixture of the two with or without fluorination. R may also be silicon containing repeat unit. This moiety could be aliphatic multicyclic, aliphatic monocyclic, alkylenic, fluoroalkylenic, phenyl, substituted phenyl, phenylalkylenic, and could be, for instance, a styrene repeat unit, a phenylmethoxy repeat unit, a methylene, alkylene, cylcoalkylene, fluoroalkylene, cycloakylene, multicyclic alkylene or multicyclic fluoroalkylene, (meth)acrylate, ethyleneoxy repeat units, copolymer of phenol formaldehyde, and the like. R may also be a silicon containing repeat unit such as a silicone (e.g —O—Si($R^{1'}$)$_2$— or —O—Si($R^{1'}$)$_2$—$R^{2'}$— and the like where $R^{1'}$ and $R^{2'}$ are aliphatic ($C_1$-$C_6$) alkyl groups or a moiety containing the ZH acidic group.

In one embodiment of this invention at least one of the ionizable groups, ZH, is pendant from a multicyclic repeating unit, either directly or through a spacer group W. FIG. 2 gives a description of possible repeating units that are useful. These may be used in homopolymers consisting of the same repeating units or alternately in more complex copolymers, terpolymers and higher homologues containing two or more of the different possible repeating units shown in FIG. 2. The ionizable group is preferably a fluoroalcohol group C($C_nF_{2n+1}$)$_2$OH (n=1-8), such as (C($CF_3$)$_2$OH).

In FIG. 2, $R_1$-$R_7$ are independently H, F, ($C_1$-$C_8$)alkyl, ($C_1$-$C_8$)fluoroalkyl, etc but at least one of $R_1$-$R_6$ has the pendant ionizable group such that the unit described in structure 1 is obtained.

Typically, polymers and copolymers containing multicyclic units are formed by polymerization of the corresponding alkenes with an active metal catalyst, a palladium or nickel complex, such as described in Hoang V. Tran et al Macromolecules 35 6539, 2002, and incorporated herein by reference. Alternatively they can also be copolymerized with various fluoroalkenes such as tetrafluoroethylene using radical initiators as disclosed in WO 00/67072 and WO 00/17712.

In another embodiment the multicylic ring is pendant from an aliphatic main chain polymer (for example from a polyvinyl alcohol or polyacrylate methacrylate polymer). FIG. 3 shows a general illustration of such materials where X is —$CO_2$—, —O—CO—O—, —O—, —$SO_2$—, —CO—NH—, $SO_2NH$—, —O—CO— with n=1 or 0; $R_1$-$R_7$ are independently H, F, ($C_1$-$C_8$)alkyl, ($C_1$-$C_8$)fluoroalkyl, $R_8$ is H, F, ($C_1$-$C_8$)alkyl, ($C_1$-$C_8$)fluoroalkyl, CN, but at least one of $R_1$-$R_8$ has the pendant ionizable group attached directly to the multicyclic unit or through a spacer group, W, to give the recurring unit described in structure 1. Preferably the ionizable group is a fluoroalcohol group, —C($C_nF_{2n+1}$)$_2$OH (n=1-8).

Typically, polymers and copolymers containing pendant multicylic rings from aliphatic polymeric backbone, are formed by either polymerization of the corresponding alkenes with a thermal radical initiator (e.g 2,2'-azobisbutyronitrile) (where in FIG. 3, X=—$CO2$—, —$SO2$—, —CO—N—, —$SO2$— —O—, —O—CO—) or by cationic polymerization with a super acid or boron trifluoride etherate (where in FIG. 3, X=—O—). The polymer synthesis is described in "Principals of Polymerization, Second Edition, George Odian, Wiley Interscience, NY, p194; 448 1981; "Preparative Methods of Polymer Chemistry, Wayne Sorenson and Tod W. Cambell, Wiley Interscience p149, 1961 and references therein.

In another embodiment, the multicylic ring is pendant from a polyether chain polymer. FIG. 4 shows a general illustration of such materials where X is a linear, branched or cyclic alkyl or perfluoroalkyl ($C_1$-$C_8$) with n=1 or 0; $R_1$-$R_7$ are independently H, F, ($C_1$-$C_8$) alkyl, ($C_1$-$C_8$) fluoroalkyl, $R_8$ is H or ($C_1$-$C_4$) alkyl and one of $R_1$-$R_8$ has the pendant ionizable group, ZH, directly attached to the multicyclic ring or through a spacer group, W, to give the unit of structure 1. Preferably the ionizable group is a fluoroalcohol group, —C($C_nF_{2n+1}$)$_2$OH (n=1-8).

Typically, polymers and copolymers containing multicylic rings pendant from the polyether backbone are formed by ring opening polymerization of the corresponding epoxide with either a base or acid catalyst; as described by "Principals of Polymerization, Second Edition, George Odian, Wiley Interscience, NY, p508 1981; "Preparative Methods of Polymer Chemistry, Wayne Sorenson and Tod W. Cambell, Wiley Interscience p235, 1961 and references therein.

The multicyclic repeat unit of FIG. 2 and the pendant multicylic unit of FIGS. 3 and 4 are substituted such that within the polymer at least one multicyclic repeat unit has the pendant ZH group to form structure 1, but the cyclic group may also have other substituents. Typical substituents are H, F, alkyl, fluoroalkyl, cycloalkyl, fluorocycloalkyl, and cyano. Examples of some of the preferred units of Structure 1 are shown in FIG. 5.

In the above definition and throughout the present specification, alkyl means linear or branched alkyl having the desirable number of carbon atoms and valence. Suitable linear alkyl groups include methyl, ethyl, propyl, butyl, pentyl, etc.; branched alkyl groups include isopropyl, iso, sec or tert butyl, branched pentyl etc. Fluoroalkyl refers to an alkyl group which is fully or partially substituted with fluorine, examples of which are trifluoromethyl, pentafluoroethyl, perfluoroisopropyl, 2,2,2-trifluroethyl, and 1,1-difluoropropyl. Alkylene refers to methylene, ethylene, propylene, etc. Alkylspirocyclic or fluoroalkylspirocyclic are cyclic alkylene structures connected to the same carbon atom, preferably where the ring contains from 4 to 8 carbon atoms, and further where the ring may have substituents, such as F, alkyl, and fluoroalkyl. Cycloalkyl or cyclofluoroalkyl are defined as aliphatic mono or multi cyclic rings containing carbon atoms and attached to a carbon atom, preferably cyclobutyl, cyclopentyl, cyclohexyl, cycloheptyl, cyclooctyl, norbornyl, adamantyl, etc., where the ring may be further substituted with fluorine, alkyl substituents or fluoroalkyl substituents.

More specifically, examples of units in the barrier polymer are exemplified by norbornene repeat units containing the fluoroalcohol pendant groups are shown in structures 1 of FIGS. 2, 3 and 4.

In another embodiment the backbone of the polymer comprises monocyclic polymer units, for use as barrier coats. Such polymeric units are exemplified in FIGS. 6 and 7. These polymers could be made by radical homopolymerization of unconjugated asymmetrical partially fluorinated dienes or by copolymerization of a fluorinated unconjugated diene with an olefin, using a radical initiator either in bulk or in a solvent. Examples of such polymerization reactions see Shun-ichi Kodama et al Advances in Resist Technology and Processing XIX, Proceedings of SPIE Vol. 4690 p76 2002; WO 02/065212, or WO 01/98834-A1, and are incorporated herein by reference. Examples of fluoroalcohol substituents which are pendant from the cyclic moiety are for example, without limitation; —C(C$_n$F$_{2n+1}$)$_2$OH (n=1-8).

In another embodiment of this invention it is envisioned that the base polymer containing the fluoroalcohol group is capped such that the capping group itself comprises an ionizable group, where the capping group makes the capped polymer more hydrophilic/acidic relative to the base polymer, and hence more readily soluble in an aqueous base. Base solubilizing, hydrophilic capping groups may be used to make the base polymer more soluble in the aqueous base developer used for developing the underlying resist and which the barrier coating protects from water. These hydrophilic/acidic capping groups may be, as non limiting examples, groups such as, —CO$_2$H, —SO$_3$H, —PO$_3$H, —SO$_2$NH—SO$_2$R', —SO$_2$—CH(SO$_2$R')$_2$, CO—CH(CO$_2$R')$_2$, (R'=aliphatic or fluoroaliphatic), or other ionizable groups and the like in which the capping group has the generalized structure —(Y)$_k$(CR'$_3$R'$_4$)$_p$-Z'H where R'$_3$ and R'$_4$ are independently H, F, (C$_1$-C$_8$)alkyl, (C$_1$-C$_8$)fluoroalkyl, cycloalkyl, cyclofluoroalkyl, (CR$_3$R$_4$)$_p$Z, R$_3$ and R$_4$ may combine to form an alkylspirocyclic or a fluoroalkylspirocyclic group, Y is selected from (C$_1$-C$_8$)alkylene, (C$_1$-C$_8$)fluoroalkylene, O(C$_1$-C$_8$)alkylene, O(C$_1$-C$_8$)fluoroalkylene, cycloalkyl and fluorinatedcycloalkyl, k=0 or 1 and p=1-4 and Z'H is an ionizable group having a pK$_a$ lower than that of the capped ZH moiety. The capping can be accomplished, for example in the non-limiting case of alkylsulfonic acid or alkylcarboxylic acid, by dissolution of Cl(Y)k(CR'$_3$R'$_4$)$_p$—SO$_3$H or Cl(Y)k(CR'$_3$R'$_4$)$_p$—CO$_2$H into excess aqueous base (e.g tetramethylammonium hydroxide) followed by addition of the desired fluoroalcohol bearing polymer. Alternatively, hydrolysis of the corresponding acid chlorides, Cl(Y)k(CR'$_3$R'$_4$)$_p$—SO$_2$Cl or Cl(Y)k(CR'$_3$R'$_4$)$_p$—COCl, in excess base followed by reaction with the fluoroalcohol bearing polymer gives similar results. This capping can be done either on the polymer containing the ZH moiety itself or its precursor monomer (e.g. alkene) containing the ZH moiety (e.g fluoroalcohol). The extent of capping is determined such that the solubility characteristics of the barrier coating are satisfied, that is, the coating is not soluble in water but is soluble in an aqueous alkaline solution. Any of the polymers described previously e.g. in FIGS. 2-7, may be partially or fully capped. FIGS. 8-13 illustrate some monomeric units that have been capped.

In another embodiment of this invention the base polymer containing the ionizable fluoroalcohol bearing groups are partially capped with a nonpolar, hydrophobic group. Nonpolar groups may be used to make the base polymer more hydrophobic, where such capping groups are exemplified by alkyl, fluoroalkyl, cycloalkyl, perfluorocycloalkyl, multicycloalkyl, perfluorocycloakly, alkylsulfonyl, fluoroalkylsulfonyl, and alkylacyl. The extent of capping is determined by the solubility characteristics required of the polymer and may range from 1-50 mole %, preferably 1-30 mole %. As non-limiting examples the polymers described in FIGS. 2-7 may be capped with the nonpolar capping groups such as groups such as CH$_2$CF$_3$, CH$_2$C$_4$F$_9$, CH$_2$CH$_3$, SO$_2$CF$_3$, CO$_2$CH$_3$, cyclohexyl, CF$_3$, CH(CF$_3$)$_2$ and the like.

In another embodiment the polymer comprises the unit of structure 1 and one or more comonomeric units, where the comonomeric unit may be any multicyclic, monocyclic, ethylenic or aromatic unit which does not contain an ionizable group but can have other properties, such as altering the solubility characteristics of the polymer or providing some other desirable lithographic properties. The comonomeric unit, incorporated at levels of 1-20 mole %, are exemplified without limitations in FIG. 13, where X is —CO$_2$H, —CO$_2$R", CO$_3$R" —O—R", —SO$_3$H, —SO$_2$—R", —CO—NHR", —CONR"$_2$, —CONH$_2$, SO$_2$NH$_2$, SO$_2$NR"$_2$ SO$_2$NHR", —O—CO—R" with R is (C$_1$-C$_8$) alkyl or (C$_1$-C$_8$) fluoroalkyl. It is within the scope of this invention that the barrier polymer comprises units with different types of ZH groups using the same polymer backbone or different polymer backbone. A polymer comprising mixtures of different types of units described by structure 1 may be used, and the polymer may further comprise other monomeric units different from structure 1. Additionally, for the polymers derived from repeat units containing the ZH moiety, other repeat units derived from other monomers may be employed, such as those containing aromatics, multicyclics, monocyclics, silicon monomers, linear or branched alkenes, fluorinated alkenes. For instance those monomeric units derived from fluorinated alkenes may also be present (e.g. tetrafluoroethylene: —CF$_2$—CF$_2$—, 1,1-difluoroethylene CF$_2$—CH$_2$ etc) or derived from multicyclic or monocyclic repeat units according to FIGS. 2-7 either not containing the ZH unit or containing different ZH units. Units derived from other monomers may also be used, such as acrylates, methacrylates, α-trifluoromethacrylates (e.g CH$_2$=CHCO$_2$CH$_3$, CH$_2$=C(CH$_3$)CO$_2$Bu, CH$_2$=C(CF$_3$)CO$_2$Et and the like), acrylic acid, methacrylic acid, α-trifluoromethacrylic acid, and the like or acrylonitrile.

It is desirable in some instances that the barrier coat for immersion lithography additionally functions as a top antireflective coating. Generally, for such a dual application, the refractive index of the barrier coat at a given exposure wavelength needs to be the geometric mean between the (refractive index of the photoresist multiplied by the refractive index of the immersion fluid), and further that the barrier coat not absorb more than 10% of the exposure radiation. Thus, the desired refractive index of the top coat is the square root of the (refractive index of the immersion liquid multiplied by the refractive index of the photoresist) at a given exposure wavelength.

For application in water ($\eta_{193}$=1.44) based immersion lithography at 193 nm with a typical 193 nm photoresist ($\eta_{193}$~1.77), the preferred polymers would have a refractive index of $(1.44\times1.77)^{1/2}$=1.6. Polymers having main chain alicyclic repeat units bearing fluoroalcohol moieties are those based upon FIG. 2 Structure I are preferred. More preferentially, poly(3-(bicyclo[2.2.1] hept-5-en-2-yl)-1,1,1-trifluoro-2-(trifluoromethyl)propan-2-ol) (Structure 2) has both a refractive index ($\eta_{193}$=1.56), and an absorbance at 193 nm (A$_{10}$: 0.026 AU/micron) which give it usefulness both for use as a top antireflective coating and as a barrier coat for use in 193 nm water based Immersion Lithography. Materials of similar structure and refractive index have similar novel utility.

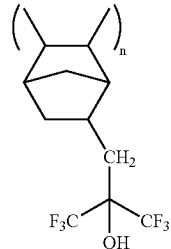

(2)

It is also within the scope of this invention that the polymer of the present invention is present in a blend with one or more other secondary polymers. The secondary polymers may be another polymer of this invention but containing different functional groups, or it may be another polymer which imparts desirable properties to the barrier coating. Examples of secondary polymers are those consisting of polyacrylic acid, polymethacrylate, poly(α-trifluoromethyl)arcrylic acid polymers whose acid moieties are partially esterified with aliphatic or fluoroaliphatic capping group and other fluorinated carboxylic acid bearing polymers having partial esterification with aliphatic or fluoroaliphatic capping groups such as $(CF_2-CF)_n-O-(CF_2)_x-CO_2H$ (x=1-6). The secondary polymer may be present at levels up to 98 weight % of the total polymer composition.

Preferred multicyclic polymers blends are those polymers made from monomers of the type illustrated in structure I of FIGS. 2, 3 and 4, which are blended with other secondary polymers. These secondary polymers may be polymers of this invention with capping groups, especially hydrophilic/acidic capping groups containing up to 100% capping.

The preferred monocyclic polymers blends are polymers consisting of repeat units such as those described in FIGS. 6 and 7 or their capped analogs. More preferably poly(1,1,2,3, 3-pentafluoro-4-fluoroalkyl-4-hydroxy-1,6-heptadiene) (as in FIG. 12(I)) and a secondary polymer. These secondary polymers may be polymers of this invention with capping groups, especially hydrophilic/acidic capping groups containing up to 100% capping.

The barrier coating of the invention comprises the polymer and a suitable solvent or mixtures of solvent. The solvents are preferably alkyl alcohols, $HOC_nH_{2n+1}$ (n=3-12, preferably 3-7), (e.g. isopropylalcohol, n-butanol, n-pentanol, n-hexanol, n-heptanol and the like), cycloalkyl alcohols $HOC_nH_{2n}$ (n=5-12, cyclopentanol, cyclohexanol and the like) alone or blended (1-20%) with either n-alkanes $C_nH_{2n+2}$ (n=7-12, e.g. n-heptane, n-octane, n-nonane, n-undecane, n-decane and their branched isomers), cycloalphatic alkanes (n=5-12, e.g cyclohexane, cycloheptane, cyclooctane and alkyl substituted derivatives) or water. Other preferred solvent blends are as follows: an alkyl carboxylate $C_nH_{2n+1}-O-CO-C_mH_{2m+1}$ (n=2-12, m=0-3) (e.g. butyl acetate, amyl acetate, amyl formate, ethyl propionate) or an analogous alkyl carboxylate based upon cyclic moieties (e.g. cyclohexyl acetate, cyclopentyl acetate) blended with an alkane $C_nH_{2n+2}$ (n=7-12)(e.g. n-heptane, n-octane, n-nonane, n-undecane, n-decane and their branched cycloalphatic isomers (e.g. cyclohexane, cycloheptane, cyclooctane and alkyl substituted derivatives). Such solvents and solvent mixtures are capable of making barrier coating solutions which are capable of being coated onto a deep UV photoresist (150 nm to 250 nm). Preferably the alcohol solvent has 3 to 7 carbon atoms. Preferably, the coating thickness of the barrier coat should be chosen such that no more than 20 weight % of the exposure light is absorbed by the barrier coat. The preferred solvent mixtures are those in which an alkyl carboxylate having 6-8 carbon atoms (e.g. amyl acetate) is blended with an alkane having 8-12 carbon atoms (e.g. decane). Typically the film thickness of the barrier coating ranges from 100 to about 20 nm.

The immersion barrier coating comprises the polymer and a solvent, and may further comprise other additives. Additives may be surfactants to form good coatings, free carboxylic acid, free sulfonic acid or its salt or other sulfone activated acids or their salts in order to reduce any acid depletion from the photoresist into the barrier coating. Free acids and their salts may cause undesirable migration of these components into the immersion fluid unless care is taken to ensure that these additives have low solubility in aqueous media. Additionally, these additives are chosen to be essentially transparent at the exposure wavelength.

For instance, in 193 nm immersion applications, non-volatile carboxylic acids which are not soluble in water are preferred and may be defined by a hydrophobic constant (Pi (Hansch)) of 2 or greater, preferably greater than 4. Pi(π) is related to the partition coefficient and measures the hydrophobicity between an organic and water phase. Values of Pi for a particular compound may be calculated using software programs, such as one available from Advanced Chemistry Lab (www.acdlab.com). Nonlimiting examples of carboxylic acids useful for barrier coat application are cholic acid (Pi of 2.35), deoxycholic acid (Pi of 4.39), litocholic acid (Pi of 6.43), adamandate carboxylic acid (Pi of 6.43), cholanic acid (Pi of 2.33), and perfluoroadamantanecarboxylic acid (Pi of 8.81). Sulfonic acids or other sulfone activated acids and their salts falling into the following description may be employed: $C_nH_{2n+1}SO_3H$ (n=4-12), $C_nF_{2n+1}SO_3H$ (n=4-8), $(C_nF_{2n+1})_2NH$ (n=4-8), $(C_nF_{2n+1})_3CH$ (n=4-8) or their amine salts $C_nH_{2n+1}SO_3^-(R'''_1 R'''_2 R'''_3 R'''_4)N^+$; where, $R'''_1, R'''_2, R'''_3$ and $R'''_4$ are independently $(C_1-C_{12})$ (alkyl, partially fluorinated alkyl, perfluorinatealkyl), $C_5-C_{12}$ (cycloalkyl, partially fluorinated cycloalkyl and perfluorinated cyclo alkyl), and additionally $R'''_1, R'''_2$ and $R'''_3$ may also be H. Perfluoroadamantanesulfonic acid (Pi of 8.81) may also be used. Preferably the sulfonic acid has a hydrophobic constant (Pi(Hansch)) of 4 or greater, preferably greater than 6. Aliphatic fluoroalcohols are sufficiently acidic to be useful as additives, especially those derived from highly fluorinated carbon hydrocarbons (e.g. hydroxyperfluoroadamantane). Typically these fluoroalcohols have a pKa of less than 4.0.

In one embodiment it is desirable to have a photoactive compound in the immersion barrier coating, preferably where the photoactive compound is sensitive to radiation used to expose the underlying photoresist. The photoactive compound may be added to the barrier coating composition prior to coating or may be present in the coating through migration from the underlying photoresist. In certain cases the addition of a photoactive compound can reduce the loss of film thickness of the unexposed area during development (dark film loss). Although any photoactive compound may be used, commonly a compound capable of producing an acid upon irradiation, a photoacid generator (PAG), of the novel composition is selected from those which absorb at the desired exposure wavelength, preferably below 300 nm, and more preferably 193 nm and 157 nm. Any PAG may be used, however, suitable examples of acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other useful onium salts such as those disclosed in U.S. patent applications with Ser. Nos. 10/439,472—filed May 16, 2003, Ser. No. 10/609,735—filed Jun. 30, 2003, Ser. No. 10/439,753—filed May 16, 2003, and Ser. No. 10/863, 042—filed Jun. 8, 2004, and are incorporated herein by reference. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyidiazomethanes, triphenylsulfonium tris(trifluoromethylsulfonyl) methide, triphenylsulfonium bis(trifluoromethylsulfonyl) imide, diphenyliodonium tris(trifluoromethylsulfonyl) methide, diphenyliodonium bis(trifluoromethylsulfonyl)

imide and their homologues are also possible candidates. Mixtures of photoactive compounds may also be used. In one preferred embodiment iodonium salts and sulfonium salts as photoactive compounds are preferred, and sulfonium salts as photoactive compounds are more preferred. The photoactive compound, preferably a photoacid generator, may be incorporated in a range from 0.1 to 10 weight % by solids, preferably from 0.03 to 5 weight % by solids, and more preferably 0.5 to 2.5 weight % by solids.

The top coating may function both as a barrier coating and an antireflective coating if the refractive index, film thickness and absorbance are adjusted such that the refractive index is the geometric mean between the refractive index of the photoresist and that of the immersion fluid, and further the barrier coat thickness does not absorb more than 10% of the incoming light.

The photoresists useful for imaging using immersion lithography and requiring a barrier topcoat may be any of those known in the art. Positive or negative photoresists may be used. Typical negative photoresists are those comprising a polymer, a photoactive compound and a crosslinking agent. The exposed region remains on the substrate and the unexposed region is developed away.

In another embodiment, in order to prevent contamination of the photoresist from bases in the environment, the polymer of the present invention may also function as a top barrier coating. The barrier coat is formed over a deep uv photoresist, and the bilayer is imaged using a standard exposure unit in the presence of air or other gases. Exposure may be done using wavelengths of 193 nm or 157 nm. The exposed photoresist is then baked and developed as is well known in the art and described later. The top barrier coat is removed during the development step since it is soluble in an aqueous alkaline solution. A polymer comprising at least one unit comprising an acidic fluoroalcohol group is especially preferred as a barrier coating polymer. Such barrier coatings are desirable for imaging photoresists that do not undergo immersion exposure, but are exposed in the presence of air or other gases. Bases in the air or a gaseous environment, especially amines, react with the photogenerated acid in the photoresist to negatively impact the lithographic image. Although the type of polymer for the barrier coat may depend on the photoresist, for typical photoresists, cycloaliphatic polymers with at least one pendant fluoroalcohol group ($-C(C_nF_{2n+1})_2OH$ (n=1-8)) is desirable. The polymer may contain additional comonomeric units, such as those described previously. The polymer may contain one or more comonomeric units, where the comonomeric unit may be any multicyclic, monocyclic, ethylenic or aromatic unit and can have other properties, such as adjusting the solubility characteristics of the polymer or providing some other desirable lithographic properties. The comonomeric unit, incorporated at levels of 1-80 mole %, are exemplified without limitations in FIG. 13, where X is $-CO_2H$, $-CO_2R''$, $CO_3R''-O-R''$, $-SO_3H$, $-SO_2-R''$, $-CO-NHR''$, $-CONR''_2$, $-CONH_2$, $SO_2NH_2$, $SO_2NR''_2$ $SO_2NHR''$, $-O-CO-R''$ with R is ($C_1$-$C_8$) alkyl or ($C_1$-$C_8$) fluoroalkyl. Cycloalpatic polymers comprising at least one unit with the multicyclic or monocyclic structures and containing an acidic pendant fluoroaclohol group ($-C(C_nF_{2n+1})_2OH$ (n=1-8)), such as those fully described above in this application, and further illustrated in FIGS. 2, 3, 4, 6 and 7, are particularly useful as barrier coating polymers, and those described in FIG. 5 being even more preferred. Polymers with a pKa of less than 9 have the desired acidity, and polymers with a pKa of less than 5 are even more desirable. Improvement in postexposure bake latitude and image profile was seen for photoresists sensitive to amine contamination and coated with the barrier coating compared to the photoresist alone.

The top barrier coating composition useful for environmental protection (dry lithography) comprises the cycloaliphatic polymer with at least one unit with a pendant acidic fluoroalcohol group and a solvent composition. Solvents which dissolve the polymer, but not the underlying photoresist, are preferred. The choice of solvent is predicated on the underlying photoresist substrate, and for 248 and 193 nm applications, the preferred solvents are alkyl alcohols, $HOC_nH_{2n+1}$ (n=3-12, preferably 3-7), (e.g. isopropylalcohol, n-butanol, n-pentanol, n-hexanol, n-heptanol and the like), cycloalkyl alcohols $HOC_nH_{2n}$ (n=4-10) (e.g. cyclopentanol, cyclohexanol and the like) (193 nm). These alcohols may be blended with water or alkanes $C_nH_{2n+2}$ (n=7-12)(e.g. n-heptane, n-octane, n-nonane, n-undecane, n-decane and their branched isomers), cycloalphatic alkanes (n=5-10) (e.g. cyclohexane, cycloheptane, cyclooctane and alkyl substituted derivatives) to make less aggressive solvents which are suitable for applications down to 157 nm. Other less aggressive solvent mixtures are also suitable for 157 nm application although these may also be used for applications with photoresists employed at longer wavelengths. These other 157 nm resin preferred solvent blends are as follows: an alkyl carboxylate $C_nH_{2n+1}-O-CO-C_mH_{2m+1}$ (n=2-12, m=0,3) (e.g. butyl acetate, amyl acetate, amyl formate, ethyl propionate) or analogous alkyl carboxylate based upon cyclic moieties (eg cyclohexyl acetate, cyclopentyl acetate) blended with an alkane $C_nH_{2n+2}$ (n=7-12)(e.g. n-heptane, n-octane, n-nonane, n-undecane, n-decane and their branched isomers), cycloalphatic alkanes (n=5-10) (e.g cyclohexane, cycloheptane, cyclooctane and alkyl substituted derivatives). The particular solvent composition chosen is one which dissolves the coating polymer and is also one which does not dissolve the photoresist coated below.

The top barrier coating composition useful for environmental protection may further comprise a photoactive compound in the immersion barrier coating, preferably where the photoactive compound is sensitive to radiation used to expose the underlying photoresist. The photoactive compound may be added to the barrier coating composition prior to coating or may be present in the coating through migration from the underlying photoresist. In many cases, a photoacid generator as a photoactive compound is preferred. Any of the photoactive compounds described in the present document may be used, especially preferred are iodonium and sulfonium salts. It has been unexpectedly been found that the presence of a photoactive compound in the barrier coating can further assist in the prevention of photoresist image degredation caused by environmental amine contamination. The photoactive compound, preferably a photoacid generator, may be incorporated in a range from 0.1 to 10 weight % by solids, preferably from 0.3 to 5 weight % by solids, and more preferably 0.5 to 2.5 weight % by solids.

The top coat composition may further comprise additives, such as, surfactants to form good coatings, free acids and compounds with a pKa of less than 5 to increase the acidity of the coating, and various other types of additives. Examples of acidic compounds are carboxylic acids, sulfonic acids (e.g. perfluoroadamantane sulfonic acid), acidic fluoroalcohols having a pKa lower than 9 (e.g. hydroxyperfluoroadamantane) and other acidic compounds having a pKa lower than 9 which have low volatility (typically boiling point of at least 100° C. but preferably above typical photoresist baking conditions (e.g. 120-160° C.). For use as amine barrier coats in non-immersion (dry) lithography, additives that are transparent at the exposure wavelength are preferred. For instance, for 193 nm and higher wavelength lithographies, non volatile aliphatic and fluoro aliphatic carboxylic acids having good solubility in aqueous base may be employed, but their high absorbance at 157 nm makes them less preferred at this wavelength. The non-volatility is to ensure that the additive is not lost from the film during the lithographic baking steps, while the high solubility in aqueous base is employed both to prevent residue formation during development and to better promote the dissolution of the barrier coat in the developer. Non volatile carboxylic acids which are preferred and may be defined by the dissociative partition coefficient between the organic and aqueous phases, log D, and represents the hydrophobicity/hydrphilicity of the additive at a given pH. Values of log D for a particular compound may be calculated using software programs, such as one available from Advanced Chemistry Lab (www.acdlab.com). The lower the value of log D the more the additive is soluble in the aqueous alkaline phase. Log D of 5 or lower at a pH of 13 is preferred. Non-limiting examples of carboxylic acids are cholic acid (log D (pH 13)−1.50), deoxycholic acid (log D (pH 13) 0.55), lithocholic acid (log D (pH 13) 2.60), adamandate carboxylic acid (log D (pH 13)−1.5), cholanic acid (log D (pH 13) 4.65), and perfluoroadamantanecarboxylic acid (log D (pH 13)−2.60). Additionally examples of sulfonic acids or other sulfone activated acids and their salts falling into the following description may be employed: $C_nH_{2n+1}SO_3H$ (n=4-12), $C_nF_{2n+1}SO_3H$ (n=4-8), $(C_nF_{2n+1})_2NH$ (n=4-8), $(C_nF_{2n+1})_3CH$ (n=4-8) or their amine salts $C_nH_{2n+1}SO_3^-R'''_1 R'''_2 R'''_3 R'''_4)N^+$; where, $R'''_1$, $R'''_2$, $R'''_3$ and $R'''_4$ are independently $(C_1-C_{12})$ (alkyl, partially fluorinated alkyl, perfluorinatedalkyl), $C_5-C_{12}$ (cycloalkyl, partially fluorinated cycloalkyl and perfluorinated cyclo alkyl), and additionally $R'''_1$, $R'''_2$ and $R'''_3$ may also be H. Preferably the acidic additive has a value of log D at a pH 13 of 5 or lower, preferably lower than 3. Aliphatic fluoroalcohols are sufficiently acidic to be useful as additives, especially those derived from highly fluorinated carbon hydrocarbons. Typically these acidic fluoroalcohols have a pKa of less than 4.0. Structures 3 and 4 below illustrate some of these additives. Preferred salts are those consisting of ammonium ($NH_4^+$) or ammonium salts of primary, secondary or tertiary alkyl amines (e.g. $NRH_3^+$, $NR_2H_2^+$, $NR_3H^+$, where R is an alkyl or fluoroalkyl moiety) with acidic compounds as defined above, whose free amine have a boiling point of less than 130° C. preferably less than 100° C.

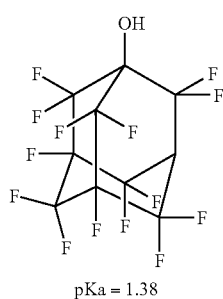

Structure 3 pKa = 1.38

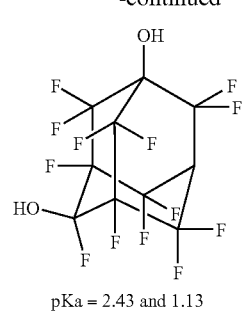

Structure 4 pKa = 2.43 and 1.13

Positive photoresists, which are developed with aqueous alkaline solutions, are useful for the present invention. Positive-working photoresist compositions are exposed imagewise to radiation; those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the formation of a positive image in the photoresist coating. Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The absorption range of these types of resists typically ranges from about 300 nm to 440 nm.

Photoresists sensitive to short wavelengths, between about 180 nm and about 300 nm can also be used. These photoresists normally comprise polyhydroxystyrene or substituted polyhydroxystyrene derivatives, a photoactive compound, and optionally a solubility inhibitor. The following references exemplify the types of photoresists used and are incorporated herein by reference, U.S. Pat. Nos. 4,491,628, 5,069,997 and 5,350,660. Particularly preferred for 193 nm and 157 nm exposure are photoresists comprising non-aromatic polymers, a photoacid generator, optionally a solubility inhibitor, and solvent. Photoresists sensitive at 193 nm that are known in the prior art are described in the following references and incorporated herein, EP 794458, WO 97/33198 and U.S. Pat. No. 5,585,219, although any photoresist sensitive at 193 nm may be used. Photoresists sensitive to 193 nm and 248 nm are particularly useful for immersion lithography using an aqueous immersion liquid. These photoresists are based on alicyclic polymers, particulary those based on norbornene chemistry and acrylate/adamantane chemistry. Such photoresists are described in the following references which are incorporated by reference: U.S. Pat. Nos. 6,447,980 and 6,365,322. Photoresists useful for imaging below 300 nm, comprise a photoacid generator that can be those described previously, but is typically an iodonium or sulfonium salt.

In the process of imaging, a photoresist composition solution is applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over organic or inorganic antireflective coatings.

The photoresist composition solution is coated onto the substrate, and then the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. A barrier coating is then applied over the photoresist coating by any of the techniques described for forming a photoresist coating. The coating may then be optionally baked at a suitable temperature to remove any remaining coating solvent mixture. If the bake is required the barrier coating may be typically baked at about 120° C. for 90 seconds. Any suitable temperature and time may be used, typically ranging from about 90° C. to about 135° C. for 30 to 90 seconds on a hot plate. The coating substrate can then be imagewise exposed to actinic radiation by immersion lithography or dry lithography, e.g., ultraviolet radiation, at a wavelength of from about 100 nm (nanometers) to about 450 nm, x-ray, electron beam, ion beam or laser radiation, in any desired pattern, produced by use of suitable masks, negatives, stencils, templates, etc. A typical immersion liquid used comprises water. Other additives may also be present in the immersion liquid.

The bilayer is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist/barrier layer-coated substrates are developed to remove the barrier coating and the image-wise exposed areas for positive photoresists or unexposed areas for negative photoresists, by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. Surfactants may also be added to the developer composition. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or preferably, dry etching. In some cases metals are deposited over the imaged photoresist.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Example 1

Synthesis of Polymer for Barrier Coating 1

The polymer, F-1 BNC (DUVCOR 385) (available from Promerus LLC 9921 Brecksville Rd, Bldg B Breckville, Ohio, 44141) was added as a dry powder to a round bottomed flask containing a magnetic stirring bar. The flask was fitted with a stopcock inlet and a vacuum of at least 5 torr was applied slowly. The flask was then immersed in an oil bath and stirred. The oil bath was then heated up to a temperature of 180° C. and the powder stirred at this temperature for 2 hours. After cooling, the powder was recovered. NMR and Infrared spectroscopic (IR) analysis revealed that the t-butyl group in the polymer had been completely removed (IR Shift of C=O band and disappearance of the CH bands and C—O band for ester, and disappearance of the tert-butyl ester CH3 peak). The material was recovered with a 95% yield. The reaction scheme for this procedure is shown below.

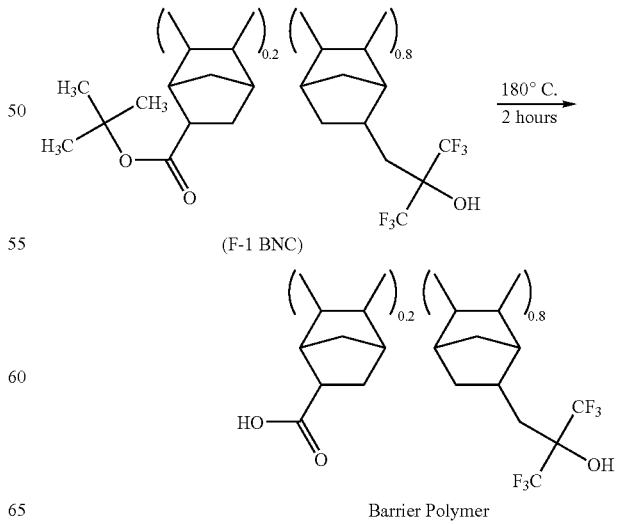

Example 2

Synthesis of F-1 tert-butoxycarbonvimethyl (BOCME) Precursor to Barrier Coat 2

The polymer F-1, poly(3-(bicyclo[2.2.1]hept-5-en-2-yl)-1,1,1-trifluoro-2-(trifluoromethyl)propan-2-ol) Mw (10,000), (available from Promerus LLC 9921 Brecksville Rd, Bldg B Breckville, Ohio, 44141) (4.0 g, 14.59 mmol) was dissolved in 15 ml of tetrahydrofuran (THF) and solid tetramethylammonium hydrxide, TMAH.5H$_2$O (0.793 g, 4.38 mmol) was added while stirring. After 30 minutes, t-butyl bromoacetate (1.71 g, 8.76 mmol) was added to this solution which was stirred for another 16 hours at 25° C. The precipitate formed in the reaction mixture was removed by filtration. The resultant filtrate was stripped of solvents in a rotary evaporator. The resultant residue was redissolved in 20 ml of MeOH containing 1.0 g of concentrated HCl. This solution was precipitated in 180 ml of water-methanol (8:1) mixture. The polymer was isolated by filtration and further purified by dissolving it into MeOH and re-precipitating it in the water-methanol mixture. The final precipitate was then filtered, washed with water and dried overnight under vacuum (25" Hg) at 55° C. The isolated yield of polymer was 91%. The presence of t-butyl (1.48 ppm) and methylene (4.27 ppm) groups were confirmed by $^1$H NMR. The extent of protection with BOCME group was found to be 28 mole %.

Example 3

Synthesis of F-1-CH$_2$CO$_2$H Barrier Coat 2

The polymer, F-1-BOCME made in Example 2 was added as a dry powder to a round bottomed flask containing a magnetic stirring bar. The flask was fitted with a stopcock inlet and a vacuum of at least 5 torr was applied slowly. The flask was then immersed in an oil bath and stirred. The oil bath was then heated up to a temperature of 140° C. and the powder stirred at this temperature for 1 hour at the oil bath temperature was raised to 180° C. and the powder stirred and heated for another hour at this temperature. After cooling, the powder was recovered. Infrared spectroscopic (IR) analysis revealed that the t-butyl group in the polymer had been completely removed (IR Shift of C=O band and disappearance of the CH bands and C—O band for ester, and disappearance of the tert-butyl ester CH3 peak). The material was recovered with a 95% yield. The reaction scheme for this procedure is shown below.

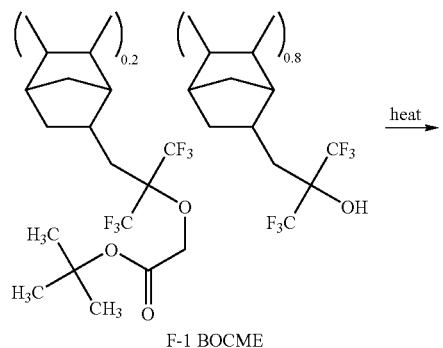

F-1 BOCME

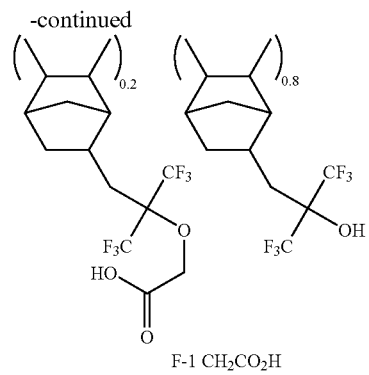

F-1 CH$_2$CO$_2$H

Equipment Used for Coating and Patterned Exposures and Analysis

Exposures at 193 nm were done with a Nikon 193 nm scanner employing annular Annular Illumination; (NA=0.75 A0.50). Coating, bake and development were done on a TEL® ACT 12 track which was linked to the Nikon tool. Top Down SEM pictures were obtained with a KLA8100 CD-SEM: each data point taken as the average of two measurement values. CDs measured at 50% threshold with 20 nm offset.

Example 4

Barrier Coating 1

A solution was prepared consisting of 7 wt % of the polymer from Example 1, (deprotected F-1 BNC) dissolved in isopropyl alcohol (IPA). This solution was spun onto a silicon wafer at 1000 rpm to give a uniform film. The film was found to be insoluble in water (after 30 second puddle) but very soluble in 0.26 N tetramethyl ammonium hydroxide (film removed in 30 seconds puddle).

Example 5

Barrier Coating 2

Similarly to Example 4, films of polymer from Example 3-Barrier Coat 2, were found to be insoluble in water (after 30 second puddle) but very soluble in 0.26 N tetramethyl ammonium hydroxide (film removed in 30 seconds puddle).

Example 6

Barrier Coating 3

A 2.13 wt % solution of poly(3-(bicyclo[2.2.1]hept-5-en-2-yl)-1,1,1-trifluoro-2-(trifluoromethyl)propan-2-ol) Mw (10,000) (obtained from Promerus LLC 9921 Brecksville Rd, Bldg B Breckville, Ohio, 44141) was obtained in 1-butanol and filtered through a 0.2 micron PTFE filter (Millex vent filter unit, cat # SLFG05010) Millipore using a syringe. This solution was spun onto a silicon wafer at 1000 rpm to give a uniform film. The film was found to be insoluble in water (after 30 second puddle) but very soluble in 0.26 N tetramethyl ammonium hydroxide (film removed in 30 seconds puddle).

Example 7

Lithographic Experiments for Barrier Coating 3

Three experiments were done to show that the use of the barrier does not disrupt the imaging capability of the 193 nm resists. These experiments were as follows:

1) A bottom antireflective coating with a film thickness of 37 nm, AZ® ArF™ 1C5D: (product from Clariant Corp. Somerville, N.J.), was coated onto a silicon substrate with a bake of 175° C. for 60 seconds. A photoresist, AZ® 1120P (available from Clariant Corp. Somerville, N.J.) was of coated over the bottom antireflective coating (spin speed 2,500 rpm, bake 120° C. 90 seconds) to give a film thickness of 200 nm). After imagewise exposure at 193 nm, the film was baked at 120° C. for 90 seconds followed by development in 300 MIF (0.26 N TMAH) for 60 seconds at 23° C.

2) A bottom antireflective coating with a film thickness of 37 nm, AZ® ArF™ 1C5D: (product from Clariant Corp. Somerville, N.J.), was coated onto a silicon substrate with a bake of 175° C. for 60 seconds. A photoresist, AZ® 1120P (available from Clariant Corp. Somerville, N.J.) was of coated over the bottom antireflective coating (spin speed 2,500 rpm, bake 120° C. 90 seconds) to give a film thickness of 200 nm). A second soft bake was done (120° C., 90 seconds). After imagewise exposure at 193 nm, the film was baked at 120° C. for 90 seconds followed by development in 300 MIF (0.26 N TMAH) for 60 seconds at 23° C.

3) A bottom antireflective coating with a film thickness of 37 nm, AZ® ArF™ 1C5D: was coated onto a silicon substrate with a bake of 175° C. for 60 seconds. A photoresist, AZ® 1120P was of coated over the bottom antireflective coating (spin speed 2,500 rpm, bake 120° C. 90 seconds) to give a film thickness of 200 nm). The barrier coating solution 3 (Example 6) was spun at 3000 rpm to give a 37 nm film and baked at 120° C. for 90 seconds. After imagewise exposure at 193 nm, the film was baked at 120° C. for 90 seconds followed by development in 300 MIF (0.26 N TMAH) for 60 seconds at 23° C.

The images obtained from the 3 tests above were examined using a scanning electron microscope. Specifically, the 100 nm 1:1 line/space features imaged at 193 nm showed no significant difference in appearance at the same dose (35.5 mJ/cm2) for all 3 tests, thus showing that the barrier coating over the photoresist does not negatively impact the lithographic process.

Example 8

Preparation of Top Barrier Coating Solution for Environmental Control

A solution was prepared by dissolving poly(tetrafluoroethylene-co-(2-fluoro,3-(bicyclo[2.2.1]hept-5-en-2-yl)-1,1,1-trifluoro-2-(trifluoromethyl)ethane-1-ol) (available from Daikin Industries Ltd. Umeda Center Building, Osaka, Japan, FRC-001) in 4.58 grams of amyl acetate. To this solution was then added 25.37 grams of decane. After the combined solution was mixed overnight, it was filtered through a 0.2 micron filter.

Example 9

Preparation of Top Barrier Coating Solution for Environmental Control

A solution was prepared by dissolving 0.6115 grams of poly(1,1,2,3,3-pentafluoro-4-trifluoromethyl-4-hydroxy-1,6-heptadiene) (PPTHH) (available from Asahi Glass, Asahi FPR 100, Mw (24,600), Mn (12400)) in 4.58 grams of amyl acetate. To this solution was then added 25.37 grams of decane. After the combined solution was mixed overnight, it was filtered through a 0.2 micron filter.

Example 10

Top Barrier Coating for Environmental Control

A solution was prepared by dissolving 0.6115 grams of poly(1,1,2,3,3-pentafluoro-4-trifluoromethyl-4-hydroxy-1,6-heptadiene) (PPTHH) (Asahi Glass, Asahi FPR 500, low MW version of FPR100, MW) in 4.58 grams of amyl acetate. To this solution was then added 25.37 grams of decane. After the combined solution was mixed overnight, it was filtered through a 0.2 micron filter.

Preparation of Photoresist Solution and Imaging at 157 nm

The imaging work was done with an Exitech 157 nm small field (1.5_1.5 mm$^2$) mini-stepper (0.6 NA) using a phase-shift mask (σ 0.3) at International SEMATECH in Austin, Tex. A JEOL JWS-7550 was used to obtain scanning electron micrographs. A Hitachi 4500 Microscope was used to obtain cross-sectional data. A FSI Polaris 2000 track was used to coat, bake, and develop of resist films. A Prometrix interferometer was used to measure resist thickness.

Example 11

Synthesis of methoxymethyl (MOM) (19%) and tert-butoxycarbonylmethyl (BOCME) (9%) Protected poly(1,1,2,3,3-pentafluoro-4-trifluoromethyl-4-hydroxy-1,6-heptadiene) Starting from MOM Protected poly(1,1,2,3,3-pentafluoro-4-trifluoromethyl-4-hydroxy-1,6-heptadiene) (PPTHH) using 25% aqueous TMAH The 19% MOM protected polymer (10 g, 30 mmol) was dissolved in 60 ml of THF and 25% aqueous TMAH (5.47 g, 15 mmol) was added while stirring. t-Butyl bromoacetate (0.71 g, 3.6 mmol) was then added to this reaction solution and stirred at room temperature for three days. The solvent was removed using rotavap at 40° C. under vacuum and the residue was dissolved in 80 ml of MeOH. The solution was treated with 15 ml of glacial acetic acid at room temperature and was precipitated in water-methanol-acetic acid (210+10+5 ml) mixture. The precipitate was filtered, washed with water-methanol (105+45 ml), water (1.5 L) and dried. The polymer was further purified by dissolving in MeOH and precipitating in water and dried under vacuum at 70° C. for 16 hours. The yield of the polymer was 92%. The presence of t-butyl (1.48 ppm) and methylene (4.27 ppm) groups were confirmed by 1H NMR. The extent of BOCME group incorporated into the polymer was 9 mol %.

Example 12

Preparation of Photoresist Solution of PPTHH Protected with 19% MOM and 9% BOCME A solution was prepared consisting of 6.787 g of PPTHH protected with 19% MOM and 9% BOCME (example 11), 89.05 g of PGMEA, 3.9583 g of a 0.4% solution of tetrabutylammonium acetate in PGMEA, and 0.19692 g of triphenylsulfonium nonaflate. The solution was allowed to mix overnight and was then filtered through a 0.2 micron PTFE filter.

Example 13

Imaging of Photoresist

The photoresist solution of example 12 was spun at 2,200 rpm onto several silicon wafers coated with an antireflective coating and baked at 135° C. One of the photoresist films was also coated with the barrier coat of example 8 by spinning this material onto the photoresist at 3,500 rpm while another was left as is. The resultant films were exposed using the Sematech Exitech tool (see above) with no delay between the exposure and the post-exposure bake (PEB) at 115° C. for 90 s. The films were developed in 0.26N TMAH aqueous solution for 30 seconds. Two other sets of experiments were done similarly as before with only the photoresist film and another with the photoresist film coated with the barrier coat described above but applying after exposure a delay of 7 minute and 14 minute before baking. For the samples with no bake delay, to resolve 70 nm 1:1.5 features, the sample with no barrier coat needed a dose of 52 mJ/cm², while the sample with the barrier coat required a somewhat higher dose (64 mJ/cm2) but was capable of better resolution and had better post-exposure bake delay latitude. The sample without the bake delay and no barrier coat resolved the 1:1.5 line:space (l:s) 70 nm features only with an exposure dose of 52 mJ/cm², but the sample with a barrier coat and no bake delay resolved 1:1 line:space 70 nm features only with an exposure dose of 64 mJ/cm². For the samples with a 7 minute bake delay, the 1:1 (l:s) and 1:1.5 (l:s) 70 nm features with an exposure dose of 52 mJ/cm² were both closed in the samples without the barrier coat while the same features in the sample with the barrier coat were fully resolved with an exposure dose of 64 mJ/cm². Similarly, for a 14 minute bake delay the 1:1 (l:s) and 1:1.5 (l:s) 70 nm features with an exposure dose of 52 mJ/cm² were both closed in the samples without the barrier coat while the same features with an exposure dose of 64 mJ/cm² in the sample with the barrier coat were fully resolved.

Example 14

Barrier Coating 4

A 1.75 wt % solution of poly(3-(bicyclo[2.2.1]hept-5-en-2-yl)-1,1,1-trifluoro-2-(trifluoromethyl)propan-2-ol) Mw (10,000) (obtained from Promerus LLC 9921 Brecksville Rd, Bldg B Breckville, Ohio, 44141) was prepared in 1-pentanol and filtered through a 0.2 micron PTFE filter from Millipore using a syringe.

Example 15

Barrier Coating 5

A 1.75 wt % solution of poly(tetrafluoroethylene-co-(2-fluoro,3-(bicyclo[2.2.1]hept-5-en-2-yl)-1,1,1-trifluoro-2-(trifluoromethyl)ethane-1-ol) (available from Daikin Industries Ltd. Umeda Center Building, Osaka, Japan, FRC-001) was prepared in 1-pentanol and filtered through a 0.2 micron PTFE filter from Millipore using a syringe.

Example 16

Barrier Coating 6

A 1.75 wt % solution of poly(3-(bicyclo[2.2.1]hept-5-en-2-yl)-1,1,1-trifluoro-2-(trifluoromethyl)propan-2-ol) Mw (10,000) (obtained from Promerus LLC 9921 Brecksville Rd, Bldg B Breckville, Ohio, 44141) and 0.6% (by solids) triphenylsulfonium perfluorobutanesulfonate was prepared in 1-pentanol and filtered through a 0.2 micron PTFE filter from Millipore using a syringe.

Example 17

Barrier Coating 7

A 1.75 wt % solution of poly(tetrafluoroethylene-co-(2-fluoro,3-(bicyclo[2.2.1]hept-5-en-2-yl)-1,1,1-trifluoro-2-(trifluoromethyl)ethane-1-ol) (available from Daikin Industries Ltd. Umeda Center Building, Osaka, Japan, FRC-001) and 0.6% (by solids) triphenylsulfonium perfluorobutanesulfonate was prepared 1-pentanol and filtered through a 0.2 micron PTFE filter from Millipore using a syringe.

Lithography for Barrier Coatings 4-7

The exposures for Barrier Coatings 4-7 were all done with a 193 nm Immersion MicroStepper (Exitech PS3000/1.05NA Corning Tropel AquaCAT) at Rochester Institute of Technology. A 9×15 array was employed using a binary L/S reticle exploying quad exposure (sc=0.818, sr=0.15).

Substrates for exposures were prepared as follows: All films were spun onto 4 inch Si substrates which were coated with 37 nm of AZ® ArF 1C5D (Product of AZ® Electronic Materials) by spinning at 1,200 rpm and a post application bake (PAB) of 200° C. for 60 seconds.

Example 18

Preparation and Imaging of the Photoresist with no Barrier Coat

A 4 inch Si wafer coated with AZ® ArF 1C5D was coated with AZ® EXP IRC 1500 (an acrylate/sulfonium salt based photoresist available from AZ Electronic Materials, Somerville, N.J., USA) at a spin speed of 1,560 rpm using a PAB of 130° C. for 60 seconds to give a film thickness of 100 nm. This wafer was exposed as described above with a 193 nm Immersion MicroStepper. After exposure the film was baked at 105° C. for 60 secs and developed in 0.26 N TMAH for 60 seconds. This film was able to resolve down to 100 nm L/S features but at the resolution dose (66 mJ/cm$^2$) gave substantial (~20%) loss of the top of the photoresist lines through dark erosion during development.

Example 19

Preparation and Imaging of the Photoresist with Barrier Coat 4

A 4 inch Si wafer coated with AZ® ArF 1C5D was coated with AZ® EXP IRC 1500 (an acrylate/sulfonium salt based photoresist available from AZ Electronic Materials, Somerville, N.J., USA) at a spin speed of 1,560 rpm using a PAB of 130° C. for 60 seconds to give a film thickness of 100 nm. Following the application of the resist, the barrier coat 4 of Example 14 was applied at a spin speed of 1866 rpm to give top-barrier coat having a thickness of 32 nm (no PAB for top coat). This wafer was exposed as described above with a 193 nm Immersion MicroStepper. After exposure the film was baked at 105° C. for 60 secs and developed in 0.26 N TMAH for 60 seconds. This film was able to resolve down to 100 nm L/S features but at the resolution dose (72 mJ/cm$^2$) still gave substantial (~20%) loss of the top of the lines through erosion during development. The use of the barrier coat 4 of example 14 did not eliminate the dark film loss of the photoresist during development.

Example 20

Preparation and Imaging of the Photoresist Barrier Coat 5

A 4 inch Si wafer coated with AZ® ArF 1C5D was coated with AZ® EXP IRC 1500 (an acrylate/sulfonium salt based photoresist available from AZ Electronic Materials, Somerville, N.J., USA) at a spin speed of 1,560 rpm using a PAB of 130° C. for 60 seconds to give a film thickness of 100 nm. Following the application of the resist, the barrier coat 5 of Example 16 (containing PAG additive) was applied at a spin speed of 1805 rpm to give top-barrier coat having a thickness of 32 nm (no PAB for top coat). This wafer was exposed as described above with a 193 nm Immersion MicroStepper. After exposure the film was baked at 105° C. for 60 secs and developed in 0.26 N TMAH for 60 seconds. This film was able to resolve down to 100 nm L/S features and at the resolution dose (68 mJ/cm$^2$) did not give any significant top loss of the photoresist and gave lines with good square profiles. Thus, where the photoresist has a propensity for dark film loss and the barrier polymer alone cannot reduce the dark film loss, the use of the barrier coating 5, containing the PAG, significantly improved the lithographic performance of the photoresist.

Example 21

Preparation and Imaging of the Photoresist with Barrier Coat 6

A 4 inch Si wafer coated with AZ® ArF 1C5D was coated with AZ® EXP IRC 1500 (an acrylate/sulfonium salt based photoresist available from AZ Electronic Materials, Somerville, N.J., USA) at a spin speed of 1,560 rpm using a PAB of 130° C. for 60 seconds to give a film thickness of 100 nm. Following the application of the resist, the barrier coat 6 of Example 16 was applied at a spin speed of 1700 rpm to give top-barrier coat having a thickness of 32 nm (no PAB for top coat). This wafer was exposed as described above with a 193 nm Immersion MicroStepper. After exposure the film was baked at 105° C. for 60 secs and developed in 0.26 N TMAH for 60 seconds. This film was able to resolve down to 100 nm L/S features and at the resolution dose (65 mJ/cm$^2$) and gave no significant loss of the top of the lines through dark film erosion during development yielding features with nice square profiles.

Example 22

Preparation and Imaging of the Photoresist with Barrier Coat 7

A 4 inch Si wafer coated with AZ® ArF 1C5D was coated with AZ® EXP IRC 1500 (an acrylate/sulfonium salt based photoresist available from AZ Electronic Materials, Somerville, N.J., USA) at a spin speed of 1,560 rpm using a PAB of 130° C. for 60 seconds to give a film thickness of 100 nm. Following the application of the resist, the barrier coat 7 of Example 17 was applied at a spin speed of 1700 rpm to give top-barrier coat having a thickness of 32 nm (no PAB for top coat). This wafer was exposed as described above with a 193 nm Immersion MicroStepper. After exposure the film was baked at 105° C. for 60 secs and developed in 0.26 N TMAH for 60 seconds. The photoresist film was able to resolve down to 100 nm US features and at the resolution dose (78 mJ/cm$^2$) gave no significant dark film loss of the top of the photoresist lines through erosion during development. Thus, where the barrier coating polymer alone reduces the dark film loss, the addition of a PAG does not have a negative lithographic effect.

Example 23

Barrier Coating 8

A 1.75 wt % solution of poly(3-(bicyclo[2.2.1]hept-5-en-2-yl)-1,1,1-trifluoro-2-(trifluoromethyl)propan-2-ol) Mw (10,000) (obtained from Promerus LLC 9921 Brecksville Rd, Bldg B Breckville, Ohio, 44141) and 0.6% (by solids) triphenylsulfonium perfluorobutanesulfonate was prepared in 1-pentanol and filtered through a 0.2 micron PTFE filter from Millipore using a syringe.

Example 24

Barrier Coating 9

A 1.75 wt % solution of poly(3-(bicyclo[2.2.1]hept-5-en-2-yl)-1,1,1-trifluoro-2-(trifluoromethyl)propan-2-ol) Mw (10,000) (obtained from Promerus LLC 9921 Brecksville Rd, Bldg B Breckville, Ohio, 44141) and 1.1% (by solids) triphenylsulfonium perfluorobutanesulfonate was prepared in 1-pentanol and filtered through a 0.2 micron PTFE filter from Millipore using a syringe.

Example 25

Lithographic Experiments for Barrier Coating 4, 8 and 9 Coated Over a Photoresist Exposed in a non-linked Track and Exposure Tool Experiments were done to evaluate the stability of a 193 nm photoresist using a barrier coating with and without PAG under conditions where the baking track and exposure tool were not linked, thus allowing the coatings to be exposed to airborne amine contamination during transfer between the track and exposure tool. These experiments were as follows:

1) A bottom antireflective coating with a film thickness of 37 nm, AZ® ArF™ 1C5D: (product from Clariant Corp. Somerville, N.J.), was coated onto a silicon substrate with a bake of 175° C. for 60 seconds. A photoresist, AZ® 1120P (available from Clariant Corp. Somerville, N.J.) was coated over the bottom antireflective coating (spin speed 2,500 rpm, bake 130° C./90 seconds), to give a film thickness of 200 nm). Barrier coating 4, from Example 14, was spin coated at 1700 rpm to produce a 32 nm thick barrier coating on top of the photoresist. After imagewise exposure at 193 nm, the film was baked at 130° C. for 90 seconds followed by development in 300 MIF (0.26 N TMAH) for 60 seconds at 23° C.

2) A bottom antireflective coating with a film thickness of 37 nm, AZ® ArF™ 1C5D: (product from Clariant Corp. Somerville, N.J.), was coated onto a silicon substrate with a bake of 175° C. for 60 seconds. A photoresist, AZ® 1120P (available from Clariant Corp. Somerville, N.J.) was coated over the bottom antireflective coating (spin speed 2,500 rpm, bake 130° C./90 seconds) to give a film thickness of 200 nm). Barrier coating 8, from Example 24 below, was spin coated at 1700 rpm to produce a 32 nm thick barrier coating on top of the photoresist. After imagewise exposure at 193 nm, the film was baked at 130° C. for 90 seconds followed by development in 300 MIF (0.26 N TMAH) for 60 seconds at 23° C.

3) A bottom antireflective coating with a film thickness of 37 nm, AZ®ArF™ 1C5D: (product from Clariant Corp. Somerville, N.J.), was coated onto a silicon substrate with a bake of 175° C. for 60 seconds. A photoresist, AZ® 1120P (available from Clariant Corp. Somerville, N.J.) was coated over the bottom antireflective coating (spin speed 2,500 rpm, bake 130° C. 90 seconds) to give a film thickness of 200 nm). Barrier coating 9, Example 25 below, was spin coated at 1700 rpm to produce a 32 nm thick barrier coating on top of the photoresist. After imagewise exposure at 193 nm, the film was baked at 130° C. for 90 seconds followed by development in 300 MIF (0.26 N TMAH) for 60 seconds at 23° C.

The images obtained from the 3 tests above were examined using a scanning electron microscope. The photoresist with barrier coating 4, which did not have any PAG additive, showed a slight tendency to form webbing of photoresist between 100 nm 1:1 line/space features, indicative of a sensitivity to amine contamination. This tendency for webbing was eliminated by using either barrier coat 8 or 9, which contained PAG, and which showed clean 100 nm L/S features.

The invention claimed is:

1. A barrier coating solution for a photoresist imaged with immersion lithography, where the barrier coating comprises an alkyl alcohol solvent and a polymer comprising an ionizable group, further where pKa of the ionizable group ranges from about −9 to about 11, and further where the barrier coating can be removed in an aqueous alkaline solution and the barrier coating has a dissolution rate of less than 1% of the film thickness while immersed for 30 seconds in water.

2. The composition of claim 1, where the polymer has the structure

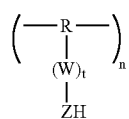

(1)

where, R is the polymeric backbone, W is a spacer group, ZH is the ionizable group, and t=0-5.

3. The composition of claim 2, where R is selected from a multicyclic polymeric backbone, a monocyclic backbone, a linear aliphatic backbone, a branched aliphatic backbone, an aromatic backbone, a fluorinated alkyl backbone and mixtures thereof.

4. The composition of claim 2, where ZH is selected from —C($C_nF_{2n+1}$)$_2$OH (n=1-8), —PhOH, ($SO_2$)$_2$NH, ($SO_2$)$_3$CH, (CO)$_2$H, $SO_3$H, $PO_3$H and $CO_2$H.

5. The composition of claim 1, where the solvent is selected from an alkyl alcohol with the structure HOC$_n$H$_{2n+1}$, where n is between 3 and 7.

6. The composition of claim 1, where the solvent further comprises an n-alkane solvent with the structure $C_nH_{2n+2}$, where n is between 3 and 7.

7. The composition of claim 1, further comprising a photoactive compound.

8. A process for imaging a photoresist comprising the steps of,
a) forming a coating of a photoresist on a substrate;
b) forming a barrier coating over the photoresist from a barrier coating solution of claim 1;
c) imagewise exposing the photoresist and the barrier coating using immersion lithography, further where the immersion lithography comprises an immersion liquid between the barrier coating and exposure equipment; and
d) developing the coatings with an aqueous alkaline solution.

9. The process of claim 1, where the barrier coating is insoluble in the immersion liquid.

10. The process of claim 1, where the immersion liquid comprises water.

11. The process of claim 1, where the barrier coating is soluble in an aqueous alkaline solution.

12. The process of claim 1, where the photoresist is sensitive to exposure wavelength between 150 nm and 450 nm.

13. The process of claim 1, where the barrier coating further comprises a carboxylate solvent and a polymer comprising an ionizable group.

14. The process of claim 13, where the polymer has the structure

where, R is a polymeric backbone, W is a spacer group, ZH is the ionizable group, and t=0-5.

15. The process of claim 14, where R is selected from a multicyclic polymeric backbone, a monocyclic backbone, a linear aliphatic backbone, a branched aliphatic backbone, an aromatic backbone, a fluorinated alkyl backbone, and mixtures thereof.

16. The process of claim 14, where ZH is selected from —C($C_nF_{2n+1}$)$_2$OH (n=1-8), —PhOH, ($SO_2$)$_2$NH, ($SO_2$)$_3$CH, (CO)$_2$NH, $SO_3$H, $PO_3$H and $CO_2$H.

17. The process of claim 13, where the barrier coating further comprises a photoactive compound.

18. The process of claim 13, where the alkyl alcohol has the structure HOC$_n$H$_{2n+1}$, where n is between 3 and 12.

19. The process of claim 13, where the solvent further comprises an n-alkane solvent with the structure $C_nH_{2n+2}$, where n is between 3 and 12.

20. The process of claim 1, where the aqueous alkaline solution comprises tetramethyl ammonium hydroxide.

21. A process for imaging a deep UV photoresist to prevent environmental base contamination comprising the steps of,
   a) forming a coating of a photoresist on a substrate;
   b) forming a barrier coating over the photoresist from a barrier coating solution of claim 5;
   c) imagewise exposing the photoresist and the barrier coating in a gaseous environment; and,
   d) developing the coatings with an aqueous alkaline solution.

22. The process of claim 21 where the polymer has a pKa of less than 9.

23. The process of claim 21 where the barrier coating solution further comprises a photoactive compound.

24. The process of claim 21 where the exposure step is in air.

25. The process of claim 21 where the exposure is at 193 nm or 157 nm.

26. The process of claim 21 where the aqueous alkaline solution comprises tetramethyl ammonium hydroxide.

27. The process of claim 21, where the solvent further comprises, an alkane or a carboxylate.

* * * * *